(12) United States Patent
Anderson et al.

(10) Patent No.: US 10,229,376 B2
(45) Date of Patent: Mar. 12, 2019

(54) DYNAMIC CONTINGENCY AVOIDANCE AND MITIGATION SYSTEM

(71) Applicants: Calm Energy Inc., New York, NY (US); The Trustees of Columbia University in the City of New York, New York, NY (US)

(72) Inventors: Roger N. Anderson, New York, NY (US); Albert Boulanger, New York, NY (US); John A. Johnson, Belle Harbor, NY (US)

(73) Assignees: Calm Energy Inc., New York, NY (US); The Trustees of Columbia University in the City of New York, New York, NY (US)

( * ) Notice: Subject to any disclaimer, the term of this patent is extended or adjusted under 35 U.S.C. 154(b) by 415 days.

(21) Appl. No.: 15/208,373

(22) Filed: Jul. 12, 2016

(65) Prior Publication Data
US 2017/0011320 A1    Jan. 12, 2017

Related U.S. Application Data

(63) Continuation of application No. 13/214,057, filed on Aug. 19, 2011, now Pat. No. 9,395,707, which is a
(Continued)

(51) Int. Cl.
*H02J 3/00* (2006.01)
*G05B 13/02* (2006.01)
(Continued)

(52) U.S. Cl.
CPC ... *G06Q 10/06315* (2013.01); *G05B 13/0265* (2013.01); *G05B 15/02* (2013.01);
(Continued)

(58) Field of Classification Search
None
See application file for complete search history.

(56) References Cited

U.S. PATENT DOCUMENTS 8,855,829 B2 * 10/2014 Golden ............... G05B 15/02
700/291
2008/0039980 A1 * 2/2008 Pollack ............... B60L 11/1824
700/295

* cited by examiner

*Primary Examiner* — Sean Shechtman
(74) *Attorney, Agent, or Firm* — Greenberg Traurig, LLP

(57) ABSTRACT

The disclosed subject matter provides systems and methods for allocating resources within an infrastructure, such as an electrical grid, in response to changes to inputs and output demands on the infrastructure, such as energy sources and sinks. A disclosed system includes one or more processors, each having respective communication interfaces to receive data from the infrastructure, the data comprising infrastructure network data, one or more software applications, operatively coupled to and at least partially controlling the one or more processors, to process and characterize the infrastructure network data; and a display, coupled to the one or more processors, for visually presenting a depiction of at least a portion of the infrastructure including any changes in condition thereof, and one or more controllers in communication with the one or more processors, to manage processing of the resource, wherein the resource is obtained and/or distributed based on the characterization of the real time infrastructure data.

20 Claims, 18 Drawing Sheets

Related U.S. Application Data continuation-in-part of application No. PCT/US2010/024955, filed on Feb. 22, 2010.

(60) Provisional application No. 61/298,886, filed on Jan. 27, 2010, provisional application No. 61/154,298, filed on Feb. 20, 2009.

(51) Int. Cl.
    *G05B 15/02*     (2006.01)
    *G05B 23/02*     (2006.01)
    *G06F 17/50*     (2006.01)
    *G06Q 10/04*     (2012.01)
    *G06Q 10/06*     (2012.01)
    *G06Q 50/06*     (2012.01)

(52) U.S. Cl.
    CPC ..... *G05B 23/0283* (2013.01); *G06F 17/5009* (2013.01); *G06Q 10/04* (2013.01); *G06Q 10/06375* (2013.01); *G06Q 50/06* (2013.01); *H02J 2003/007* (2013.01); *Y04S 10/54* (2013.01)

DYNAMIC CONTINGENCY AVOIDANCE AND MITIGATION SYSTEM

CROSS-REFERENCE TO RELATED APPLICATIONS

This application is a continuation in part of International Application No. PCT/US2010/024955, filed Feb. 22, 2010, which claims the benefit of U.S. Provisional Application Ser. No. 61/154,298 filed on Feb. 20, 2009, and U.S. Provisional Application No. 61/298,886, filed on Jan. 27, 2010. The entirety of each of the above applications are explicitly incorporated by reference herein in their entirety.

COPYRIGHT NOTICE

A portion of the disclosure of this patent document may contain material which is subject to copyright protection. The copyright owner has no objection to the facsimile reproduction by any one of the patent disclosure, as it appears in the Patent and Trademark Office patent files or records, but otherwise reserves all copyright rights whatsoever.

FIELD

The disclosed subject matter relates to control systems for infrastructure-based businesses (e.g., water, electric, oil and gas companies) that allocates resources (e.g., the distribution of electricity) to customers from one or more sources based on predicted future events (e.g., contingencies) and/or events observed in real time.

BACKGROUND

Infrastructure-based businesses (such as water, electric, oil and gas companies) must determine how to allocate available resources to their customers in view of current and future conditions. Fundamental changes on both the supply-side and consumption-side of resources, as well as technological advancements that provide increased granularity of resource utilization, combine to make allocation decisions more complex.

For example, electrical utilities have traditionally generated power at remote plants and delivered electricity to residential, business or industrial customers via transmission networks and distribution grids. Going forward, however, electrical power is increasingly provided by additional distributed sources, such as wind, tidal, geothermal, solar and other alternative energy sources, as well as electricity generated and/or stored by third parties, such as batteries. Due, at least in part, to the shift away from fossil fuels towards the "electron economy," electricity sinks have also become more varied. The advent, and increased use of, for example, power supply batteries, compressed air storage, electrical vehicles and trains, as well as the presence of large consumers of electricity (such as public transit companies) renders the proper allocation of electricity more important. Water, sewage, oil and gas distribution networks are also increasing in complexity. All these infrastructures are in need of more intelligent management so that our modern civilization will not be disrupted.

FIG. 1 shows a conventional infrastructure 100 associated with the generation, transmission and distribution of electrical power to residential, business, and industrial customers. Infrastructure 100 can be viewed as having four primary sections, namely, generation 110, transmission 120, primary distribution 130, and secondary distribution 140. Generation 110 involves a prime mover, which spins an electromagnet, generating large amounts of electrical current at a power plant or generating station. Transmission 120 involves sending the electrical current at very high voltage (e.g., at hundreds of kV) from the generating station to substations closer to the customer. Primary distribution 130 involves sending electricity at mid-level voltage (e.g., at tens of kV) from substations to local transformers over cables (feeders). Each of the feeders, which can be 10-20 km long (e.g., as in the case of Consolidated Edison Company of New York, Inc.'s distribution system in New York City), supplies electricity to neighborhoods using a few tens of local feeders connecting each area substation to a few tens to hundreds of local transformers. Each feeder can include many cable sections connected by joints and splices. Secondary distribution 140 involves sending electricity at nominal household low voltages from local transformers to individual customers over radial or networked feeder connections.

FIG. 2 illustrates an exemplary infrastructure 200 that illustrates the additional complexities utilities now encounter. Power generated from remote sources (e.g., a nuclear power plant) supply the electric distribution grid 205 with limitations of electricity throughput that is supplemented by local distributed generators 210 and renewables like solar sources 220. Electricity sinks can be distinguished based on whether they represent a non-curtailable load 230 or a curtailable load 240. Electrical customers, or the utility itself, can also store energy for later consumption 250 (e.g., to take advantage of temporary drops in the price of electricity or local shortages in supply), representing both an electrical sink and an electrical source. Charging electrical vehicles 260, which are also capable of supplying electricity to the grid similar to a mobile energy storage device, further place additional demands and complexities on the utility and transportation infrastructures. In addition, water and sewage systems are very large users of electrical power that also must be intelligently managed given multisource and multisink variability.

Given the increased complexities faced by all infrastructure-based businesses, there remains a need to provide for the orderly and efficient distribution of resources to consumers, such as, but not limited to, the efficient allocation of electricity to consumers. Such a new, smart, distribution grid will be needed to control the coming electric economy dominated by electric vehicles, electric trains, subways, and buses, and partially powered by alternative wind, solar, and other distributed energy generation and storage resources (hereafter "DR").

SUMMARY

By combining disparate analytical applications for capital allocation, such as reliability analysis of equipment and machine learning analysis of the health of assets, with forecasted and historical recording of energy/commodity flow and transactions, the presently disclosed subject matter provides a Dynamic Contingency Avoidance and Mitigation System (DCAMS) for infrastructure-based businesses such as water, electric, oil, and gas companies.

One aspect of the presently disclosed subject matter provides a Dynamic Contingency Avoidance and Mitigation System (DCAMS) for facilitating distribution of a resource. In an exemplary embodiment, the system includes one or more processors, each having respective communication interfaces to receive infrastructure network data descriptive of the resource from the infrastructure, one or more software applications, operatively coupled to and at least partially controlling the one or more processors, said one or more software applications including a characterizer for generating characterized infrastructure network data based on at least a portion of said infrastructure network data and a predictor for generating predictive infrastructure network data and/or actions based on at least a portion of said infrastructure network data; a display, coupled to the one or more processors, for visually presenting a depiction of at least a portion of the infrastructure including any relevant changes in condition thereof, based on the characterized infrastructure network data and/or the predictive infrastructure network data and one or more controllers in communication with the one or more processors, to manage processing of the resource, in which the resource is obtained, conserved and/or distributed based on the characterization of the infrastructure network data.

In one embodiment, the infrastructure is an electrical grid and the resource is electricity. In association with a "smart grid," the electricity can be obtained, at least in part, from alternative energy sources such wind power, solar power, battery power, geothermal power, tidal power, hydroelectric and nuclear power. The electrical grid can further include curtailable loads, such as the load associated with the charging of electrical vehicles and certain consumers of electricity capable of changing their consumption of electricity at a given time (e.g., to switch to alternative power sources). Alternative energy sources can be applied, and/or curtailable energy loads can be curtailed, based on predicted or observed loads in view of, for example, predicted weather and customer use patterns.

In a further embodiment, the characterizer for generating characterized infrastructure network data includes a reliability analyzer that analyzes the reliability of electrical grid equipment. These future events can be predicted in view of predicted failure patterns recognized by machine learning and/or customer responses to hypothetical changes to the real-time cost of the electricity to the customer. Actual preventative maintenance and/or pricing changes can be implemented based the predicted responses to such impending failure patterns and pricing changes.

The software applications included within the DCAMS can include a machine learning engine. The machine learning engine can include, for example, one or more martingale boosting algorithms, a Support Vector Machine (SVM) algorithm, Monte Carlo risk assessment modeling or a combination thereof. The display of the DCAMS can further include a web-based user interface.

BRIEF DESCRIPTION OF THE DRAWINGS

Further features of the disclosed subject matter, its nature, and various advantages will be more apparent from the following detailed description of the embodiments and the accompanying drawings in which.

DETAILED DESCRIPTION

Figure 1:
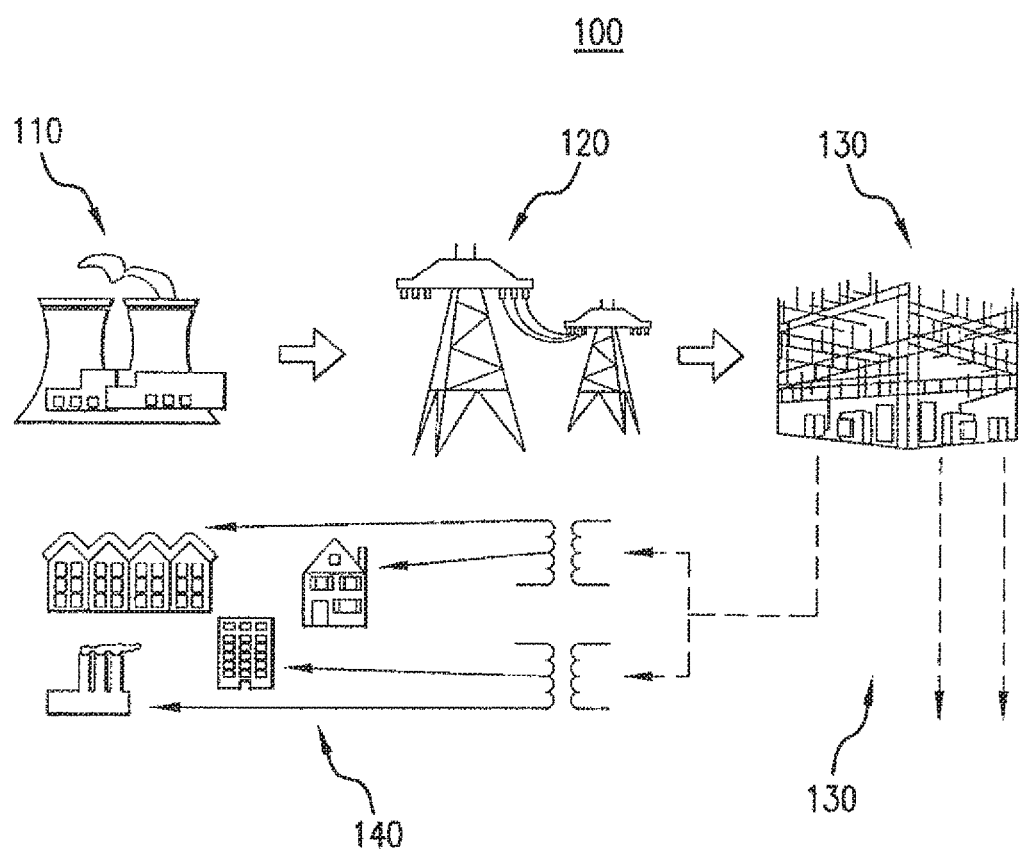
FIG. 1 is a schematic diagram illustrating the traditional infrastructure associated with the generation, transmission and distribution of electricity to customers.
Figure 2:
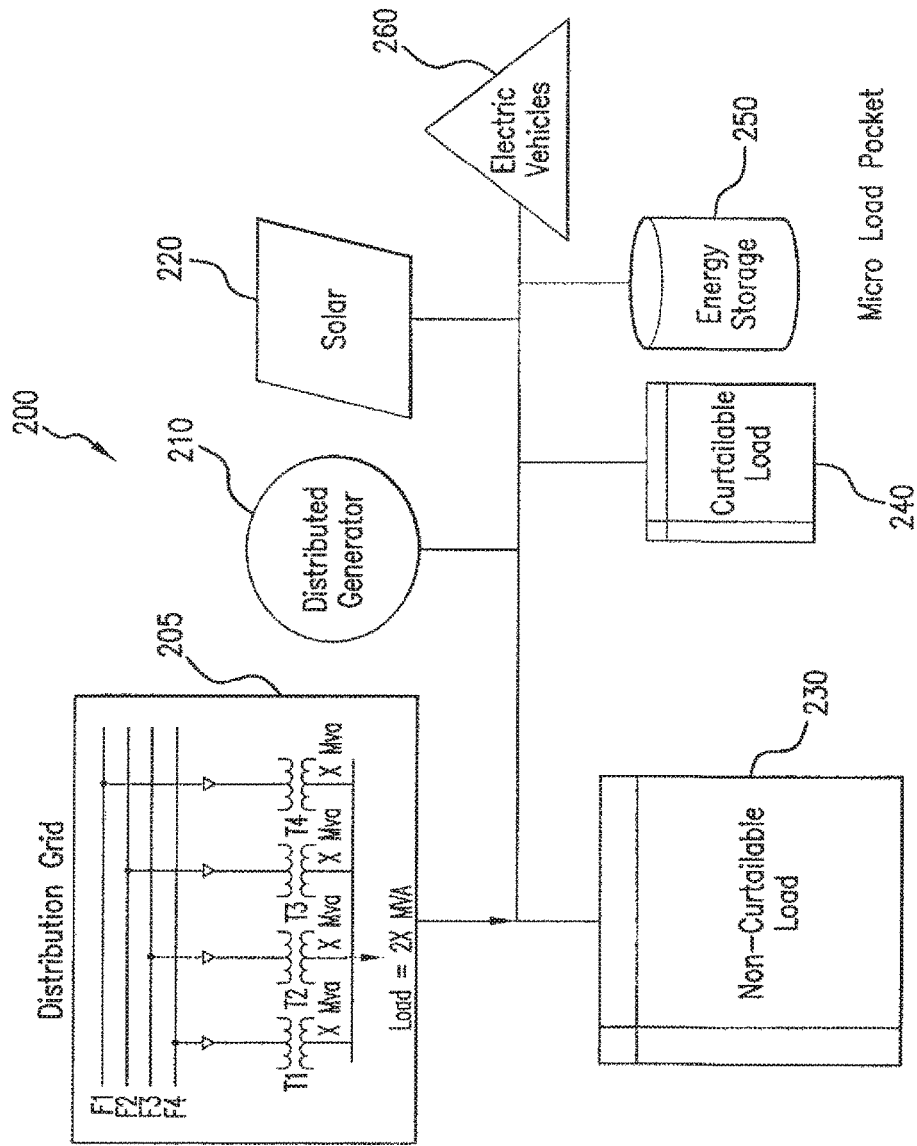
FIG. 2 is a block diagram illustrating additional features and complexities associated with the modern electrical grid, including distributed generators (210), solar power sources (220), non-curtailable (230) and curtailable (240) loads, energy storage capabilities (250) and electrical vehicle sinks and sources (260).

The presently disclosed subject matter provides a decision support software system that predicts potential disruptive events, contingencies, in a distribution system before they happen based on, for example, Machine Learning, and computes and communicates contingency and real-time management decisions to most efficiently allocate available resources (e.g., electricity) to carry out pre-emptive actions (e.g. preventative maintenance, curtailment of load, etc.) in order to prevent resource shortfalls (e.g., electricity outages), additional infrastructure harm or failure, and associated harm to the public. Referred to herein as the Dynamic Contingency Avoidance and Mitigation System (DCAMS), the system simultaneously estimates future needs and interactions and responds to real-time events to provide accurate, controller-based costing and pricing of the commodity (e.g., reliability based pricing of electric service in a micro-load pocket), curtailment actions, and management mechanisms in order to prevent outages, equipment failure, emergencies, and contain events that have already taken place.

In various embodiments of the presently disclosed subject matter, DCAMS communicates contingency and real-time management decisions to utilities and DR owned and operated by their customers. This optionally, combined with lean management principles, provides a DCAMS that both estimates future needs and interactions and responds to real-time events to provide accurate, preventive maintenance, controller-based pricing, curtailment and load pocket management mechanisms. DCAMS can recommend additions from DR, load shedding and other operations such as switching, crew deployment, and improved work processes to reduce the risk of power disruptions, equipment failure, and harm to people.

The DCAMS enhances the safety and security of the distribution system (e.g., an electrical grid) by improving reliability and safety on at least two fronts: The first is through the use of the simulation component to predict the effects of possible control actions, thereby permitting both human and computer decisions to be made with a better understanding of the ramifications of a particular sequence of actions (e.g., an electrical simulation component). The simulation can also be used to monitor the effects of a sequence of actions in order to detect and warn of anomalous behavior. The second is through the use principles to detect those longer-term infrastructure enhancements that are most likely to have the greatest positive impact on performance and to then recommend the stronger more successful enhancements. In this regard, the methods disclosed in U.S. Published Application No. WO 2009/117742, hereby incorporated by reference in its entirety, can be used in conjunction with the presently disclosed DCAMS.

In the context of an electrical grid, DCAMS manages additions from Distributed Resources such as power supply storage and generation, load shedding and other operations such as switching, crew deployment, and improved work processes to alleviate risks of power disruptions and equipment failure, and to distribute power more effeciently. DCAMS also allows utilities to prepare in advance and to respond in real-time to detailed customer issues such as load pocket constraints (e.g., low voltage condition). By implementation of reliability based pricing and curtailment strategies, made possible via DCAMS, the need to build additional distribution feeders in this load pocket or build additional generating resources can be reduced or rendered unnecessary.

DCAMS receives real-time measured load and supply modulations such as from electric vehicles, building loads, and supplies like energy storage and distributed generation and predicts future response and availability of these DR. Verification of the effects of curtailment orders and pricing and cost changes is a part of the controller's decision-making process. DCAMS is also used by transmission and distribution engineering personnel to accurately evaluate capital asset upgrade options within high risk load pockets (e.g., from the micro level of a large customer to the Area Substation level).

Embodiments of the presently disclosed subject matter utilize the stochastic controller technology disclosed in U.S. Pat. No. 7,395,252, granted Jul. 1, 2008 and hereby incorporated by reference in its entirety. A machine learning system can be used to train power control system operators, for example, to take suitable actions to respond quickly to fluctuations or interruptions in electricity flow anywhere in the power grid. The controller can be configured as a computer-based simulation and training tool that learns the "best response scenarios" to specific events on the grid, which for example, can lead to critical failure cascades across integrated generation, transmission, and distribution grids such as the Eastern North American inter-connected grid, if not controlled.

For example, the subject regional and distribution power grids can be modeled using commercially available power flow and short-circuit modeling tools (such as Distribution Engineering Works Station (DEW), sold by EDD, Inc. Blacksburg, Va., and EPRI Solutions, Inc. Palo Alto, Calif.). DEW can, for example, model inverter and synchronous distributed generation power flow, as well as multiple-source fault analysis. DEW is in use in the power industry as a real-time simulator of a utilitys' distribution system, for example, in conjunction with the utilitys' Supervisory Control And Data Acquisition (SCADA) systems and/or its energy management systems (EMS) and their associated data historians.

DEW also can be used to model regional grid behavior using, for example, Federal Energy Regulatory Commission (FERC) data. Various types of powerflow models exist that can be used for analysis in connection with peak load leveling, peak shaving, voltage correction, right sizing of equipment, and machine learning.

One embodiment of the presently disclosed subject matter provides a web service for initiation of, interactive adjustments to, historian recording of, and human and machine training in the operation of the DCAMS. This can be achieved through access to the outputs of an integrated workflow of a plurality of analytical computer applications for characterization and analysis of operational traits, improved management of capital and human resource allocation for maintenance and operational response, and commodity or energy transaction decisions for infrastructure-based businesses such as water, electric, oil, and gas companies. The DCAMS is ideal in electric economies of now and in the future, such as New York which is, or can be, dominated by electric vehicles, electric trains, subways, buses and other energy sources such as alternative wind, solar and other distributed energy generation and storage resources (DR).

The presently disclosed subject matter can improve and account for operational responses of the workforce to events in a seamless and remotely accessible package. Problems caused by the disparate nature of business, regulatory, and engineering requirements and techniques are solved through software wrappers to allow specific rules and regulations written into scripts to be read into the DCAMS. The presently disclosed subject matter advances the current state of the art to utilize market and dispatch mechanisms to solve congestion of energy or commodity flow and human resource allocation with the least risk and cost possible. The DCAMS also permits the simulation and record keeping necessary to plan for and implement new operational strategies that can in turn permit the incorporation of alternative energy sources. Smart feedback from the power consumers, both large and small, to the DCAMS allows it to anticipate demand and demand response potential, and coordinate the operations of diverse DRs and other supply to produce the least pollution and lowest carbon dioxide emissions at the lowest cost while maintaining reliability expectations. Such feedback can include how much DR can respond in a given time interval in terms of reduced load and over what time frame and when such capability would be available from that DR.

The DCAMS predicts future disruptive events in the distribution system before they happen based on, for example, machine learning, and communicates contingency and real-time management decisions to utilities and DR (distributed energy generation and storage resources) owned and operated by their customers. See U.S. Pat. No. 7,395,252, granted Jul. 1, 2008 and hereby incorporated by reference in its entirety.

In one embodiment, machine learning ranking algorithms such as, for example, support vector machines and boosting and adaboosting for ranking of susceptibility to failure of electrical components based on predicted levels of attributes versus what is observed in real time. See, generally U.S. Published Application No. 2009/0157573 and T. Zhang, "Convex Risk Minimization, Annals of Statistics, 2004, each of which is hereby incorporated by reference its entirety. Through this ranking mean time between failure (MTBF) is approximated for failure of assets in a predicted or forecasted future state. Through a topological model of the electric distribution grid, algorithms performing sequential Monte Carlo analysis can be used where mean time to repair (MTTR) of various responses that are available for restoration improvement are included in the sequential or non sequential Monte Carlo analysis. The MTTR for these actions can be learned through experience from past directed actions first as averages and then moving to the application of prediction algorithms, as disclosed, for example, in International Published Application No. WO 2009/1177421 (hereby incorporated by reference in its entirety.

In one embodiment, the DCAMS employs the on-policy Monte Carlo control method in order to improve methods to evaluate or improve on the policy that is used to make decisions on actions such as adding electric supply from distributed generation or reducing loads at specific nodes to reduce vulnerabilities or risk. One advantage of using Monte Carlo methods is that it provides an alternative policy evaluation process. Rather than use a model to compute the value of a state, the Monte Carlo methods average many options for returning to the start state. The Monte Carlo method can be combined with dynamic programming or ADP to find policies on top of Monte Carlo.

Figure 3:
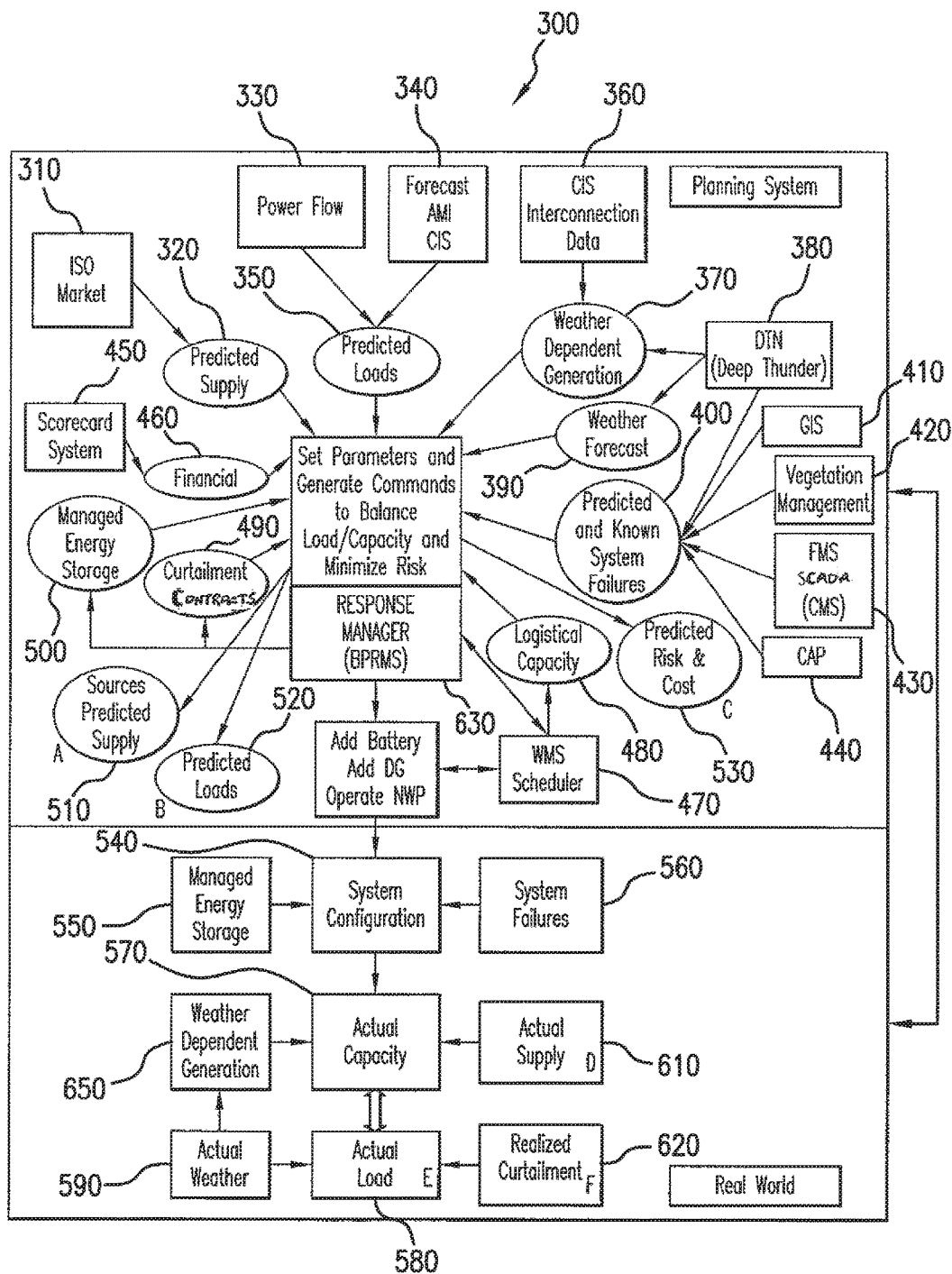
FIG. 3 depicts a DCAMS system, according to one non-limiting, exemplary embodiment.

An overview of the DCAMS system, according to one non-limiting, exemplary embodiment (300), is represented in FIG. 3. The DCAMS system incorporates both predictive models (shown in FIG. 3 in ovals) and real-time data from the field (shown in rectangles). In this embodiment, the system includes a planning system and a real world system, which receives output from the planning system to assist in controlling the electrical grid in view of real-time information from the field.

The planning system is described first below. As shown in FIG. 3, Independent System Operator (ISO) market data (310) is sent to, and processed within a predicted supply model (320) that anticipates the amount of supply needed and to be made available based on historical matches to coming weather conditions, contractual agreements of supply availability (e.g., interconnected electric vehicles and/or distributed generation at a specific location), and daily and seasonal usage patterns. Power flow algorithms (330) in concert with forecasted AMI/CIS (Automated Meter Intelligence/Customer Information System) load data (340) is sent to a predictive model to estimate predicted loads (350) at critical locations (e.g., Load Pockets). CIS and Interconnection data (360) on predominately weather dependent generation (e.g., solar, wind) is sent to a weather dependent generation predictive model (370) to estimate, for example, the availability of solar and/or wind power available to supplement centralized power plant supply of electricity for a specific location. Output from high resolution and low resolution weather bureau predictions such as from DTN weather forecasts and Deep Thunder (DTN) (380), a service available from IBM to provide local, high-resolution weather forecasts specific to neighborhoods, is also sent as an input to the weather dependent generation predictive model and also to a weather forecast predictive model (390). Output from these weather bureau forecasts is also sent to a predictive model used to predict and display known system failures (400) some of which are highly weather likely under adverse weather conditions (e.g., wind fallen on overhead power lines).

The predicted and known system failures model (400) also receives real-time data from GIS (geographic information systems) (410), vegetation management history (420), Feeder Management System, Supervisory Control and Data Acquisition System (SCADA) Outage Management System (430) and data output from the contingency analysis program (440), which is disclosed in International Published Application No. WO 2009/117741, hereby incorporated by reference in its entirety.

A scorecard system (450) sends data to a financial predictive model (460). The financial predictive model quantifies the value of smart grid technologies, which in turn relies upon measuring the cost and customer convenience of the specific use of these technologies. In addition, the scorecard system tracks outages and equipment failures. Exemplary scoreboard systems according to one embodiment of the presently disclosed subject matter is described in greater detail below.

A Work Management System or Scheduler (WMS) (470) that includes, among other things, warehouse supplies, worker availability, tool availability, vehicle availability and shop management information to send data to a model used to estimate logistical capacity (480). Each of the predictive models discussed above and as shown in FIG. 3 are transmitted to the DCAMS, along with information about curtailment contracts (490) and managed energy storage (500). The DCAMS outputs sources of predicted loads (520), predicted supply (510) and predicted risks and costs (530) for better DCAMS decisions. In one emodiment, DCAMS uses such technologies as described in U.S. Pat. No. 7,395,252, which is hereby incorporated by reference in its entirety.

In the embodiment represented in FIG. 3, the DCAMS also submits recommended actions to a control center operator, or alternatively, implements those actions with electronic messages via the Response Manager (630). Examples of recommended actions during a time of tight period of tight power supply can include, for example, instructions to add battery sources or distributed generation, instructions to stop the charging of electrical vehicles or energy storage (500) and/or to withdraw current from the electrical vehicles and/or energy storage, and to cut power to other curtailable loads (490) under contract.

The system configuration (540) also receives input from real-time data from managed energy sources (550), system failures (560), actual capacity (570) and actual load (580), actual weather (590), weather dependent generation (600), actual supply (610) and realized curtailment (620) to provide real time evaluation of the state of the system at specific locations for mitigation, containment, and restoration purposes.

In this example, the DCAMS uses a Monte Carlo control method in order to compute methods to evaluate or improve on the policy that is used to make decisions on actions such as adding electric supply from DR sources or reducing loads at specific nodes to reduce vulnerabilities and risk. Control strategies facilitate efficient distribution of electricity by applying curtailment, by moving portable sources, by prioritizing maintenance and emergency response, as well as directing surgical replacements and upgrades to the points of greatest vulnerability. The price responsiveness of curtailable customer's behavior and the times needed to deploy resources, such as batteries, is also learned by the DCAMS.

In one embodiment, the DCAMS employs a data historian to record the configuration of DCAMS by time and date, so that any previous date and time can be recalled from memory to see the data, systems configuration, recommended actions and results of those action recommended by the DCAMS at that past time.

The presently disclosed subject matter contains decision aids that utilize the contingency calculations to provide transparency to stakeholders. The assumptions, analytic processes, input and output data used for each analysis can be readily retrieved and re-evaluated for future auditing, training, and/or effort justification. Thus, access to, input and output from all workflows, present or past, and analytical tracking of decisions made in the field is provided.

It is often desired in the execution of science and engineering computations to keep a notebook with a record of all experiments and the trail and errors and successes, as well as observations and analyses of events occurring during the experiment. In performing complicated tasks such as evaluation of decision processes between various resource requirements and asset allocations in complex infrastructure systems, and design basis decisions such as improving or optimizing how electrical equipment and computational software are configured, records must be kept of all decisions so that it can later be established that they were carefully made based upon the best information available at the time. The presently disclosed subject matter can use the notebook and historian technologies disclosed, for example, in U.S. Pat. No. 6,826,483, hereby incorporated by reference in its entirety.

Figure 4:
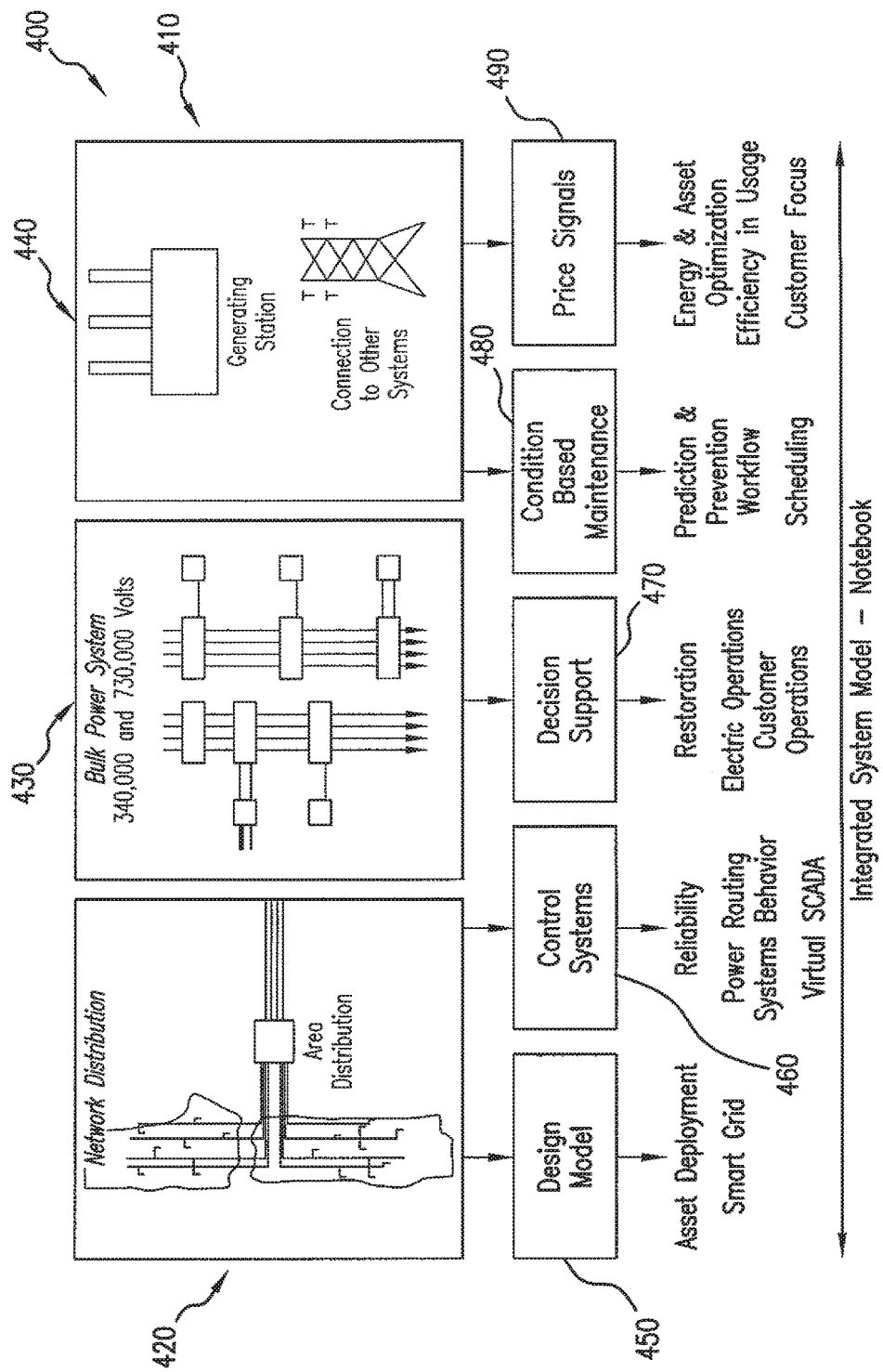
FIG. 4 depicts an exemplary Integrated System Model including drill down access to features of an electrical grid and its control system.

An exemplary Integrated System Model Notebook (400) is shown in FIG. 4. In this embodiment, a display layer (410) is provided that includes drill down access to a network distribution layer (420), a bulk power system layer (430) and a layer detailing connection to other large sources of electricity (e.g., other generating systems or connection to other systems) (440). In this embodiment, the DCAMS provides the ability to, for example, control asset deployment within the smart grid (e.g., maintenance crews in the field, or maintenance crews working in connection with capital improvement projects based on the design model (450). Power Routing and Virtual SCADA (Supervisory Control and Data Acquisition System) functionalities are provided within the control system (460). For example, the system can use data coming in from the Remote Monitoring System (RMS) to sense the electrical load on transformers in the streets and feeders at each substation.

This embodiment of the present application also provides decision support (470) of, for example, electric operations, such as decisions regarding power restoration and information about customer operations and load projections in connection thereto. Also provided is the ability to provide condition-based maintenance (480) based on real-time conditions and machine learning. For example, through the use of machine learning, future events can be predicted and prevented, workflow can be dispatched to replace susceptible equipment before it breaks and maintenance scheduling can be coordinated. See U.S. Published Application No. 2009/0157573 for disclosure regarding machine learning that can be used in conjunction with this embodiment. This reference is hereby incorporated by reference in its entirety.

The non-limiting embodiment shown in FIG. 4 also receives input and facilitates process control via price signals (490) regarding the commodity or resource at issue (e.g., the cost of electricity). The ability to have access to, and incorporate price signals into the calculus of process control provides for energy and asset improvement, efficiency in usage and increased customer focus and satisfaction.

Figure 5:
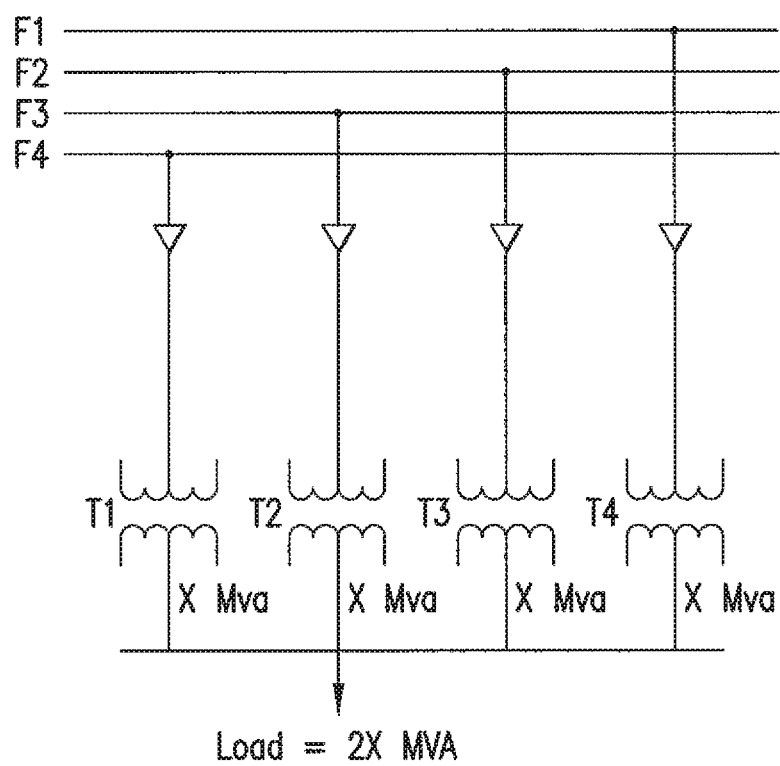
FIG. 5 depicts a four transformer HTV that hypothetically serves a load pocket in an urban area as described in Example 1.

Various embodiments of the presently disclosed subject matter allows, for example, a utility to prepare in advance and to respond in real-time to detailed customer issues such as load pocket constraints at transformer High Tension Vaults (HTV) for large customers such as that in FIG. 5 or in overhead loop feeders. This level of granularity results from accurate measurement and prediction of curtailable loads such as electric vehicles, building loads, and supplies like energy storage. Verification of curtailment is a part of the controller's decision-making process. The same DCAMS can be used by Distribution Engineering to accurately evaluate capital asset upgrade options within high risk load pockets (e.g., at the micro level of a HTV) all the way through to the Area Substation level.

FIGS. 14-18 provide screenshots from a display, coupled to one or more processors, that visually presents a depiction of a portion of an electrical grid according to a non-limiting embodiment of the disclosed subject matter. An area substation is depicted to provide transmission power flow contingency models that interface with SCADA systems.

Figure 14:
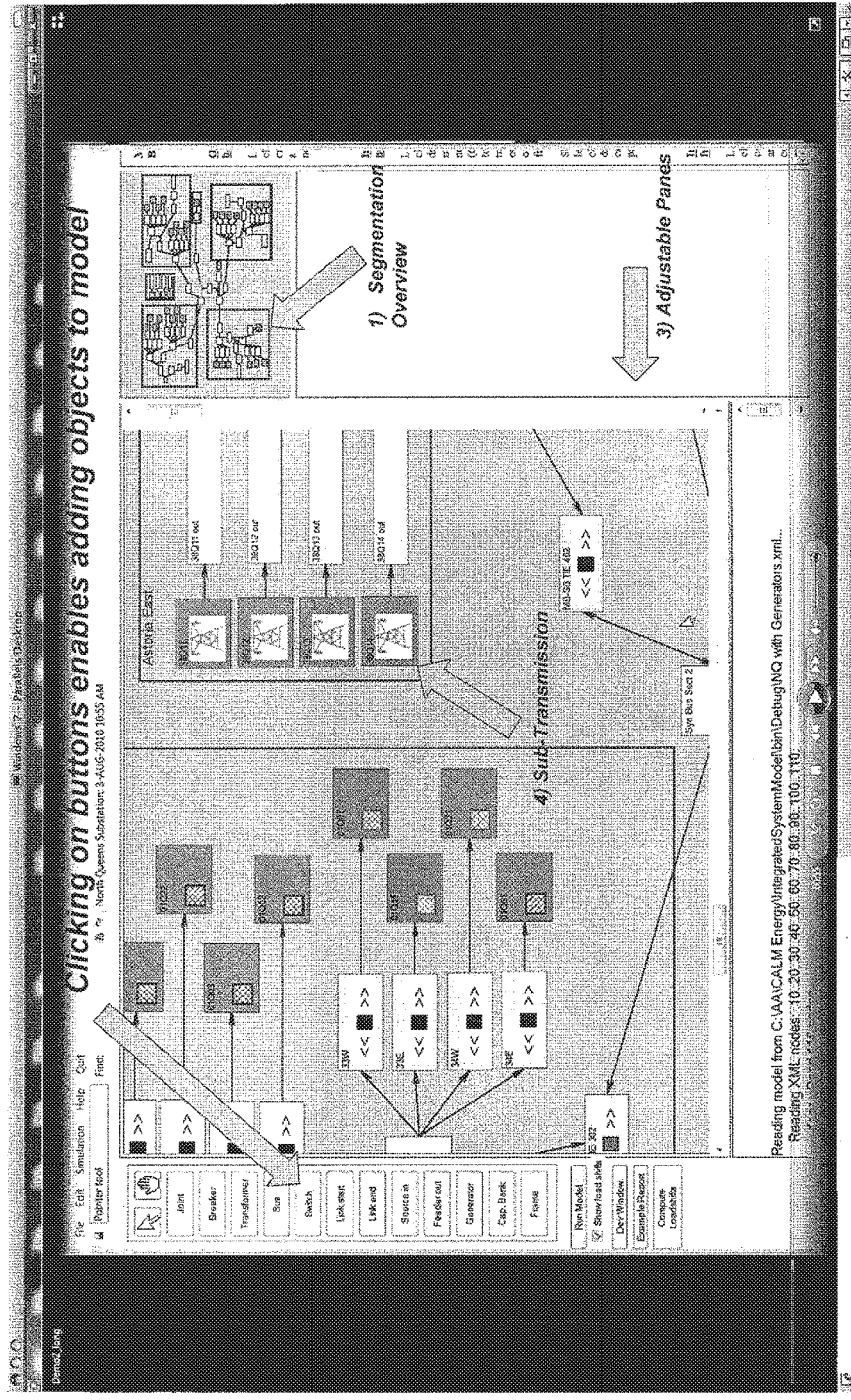
FIGS. 14-18 are screenshots from a display, coupled to one or more processors, that visually presents a depiction of a portion of an electrical grid.
Figure 15:
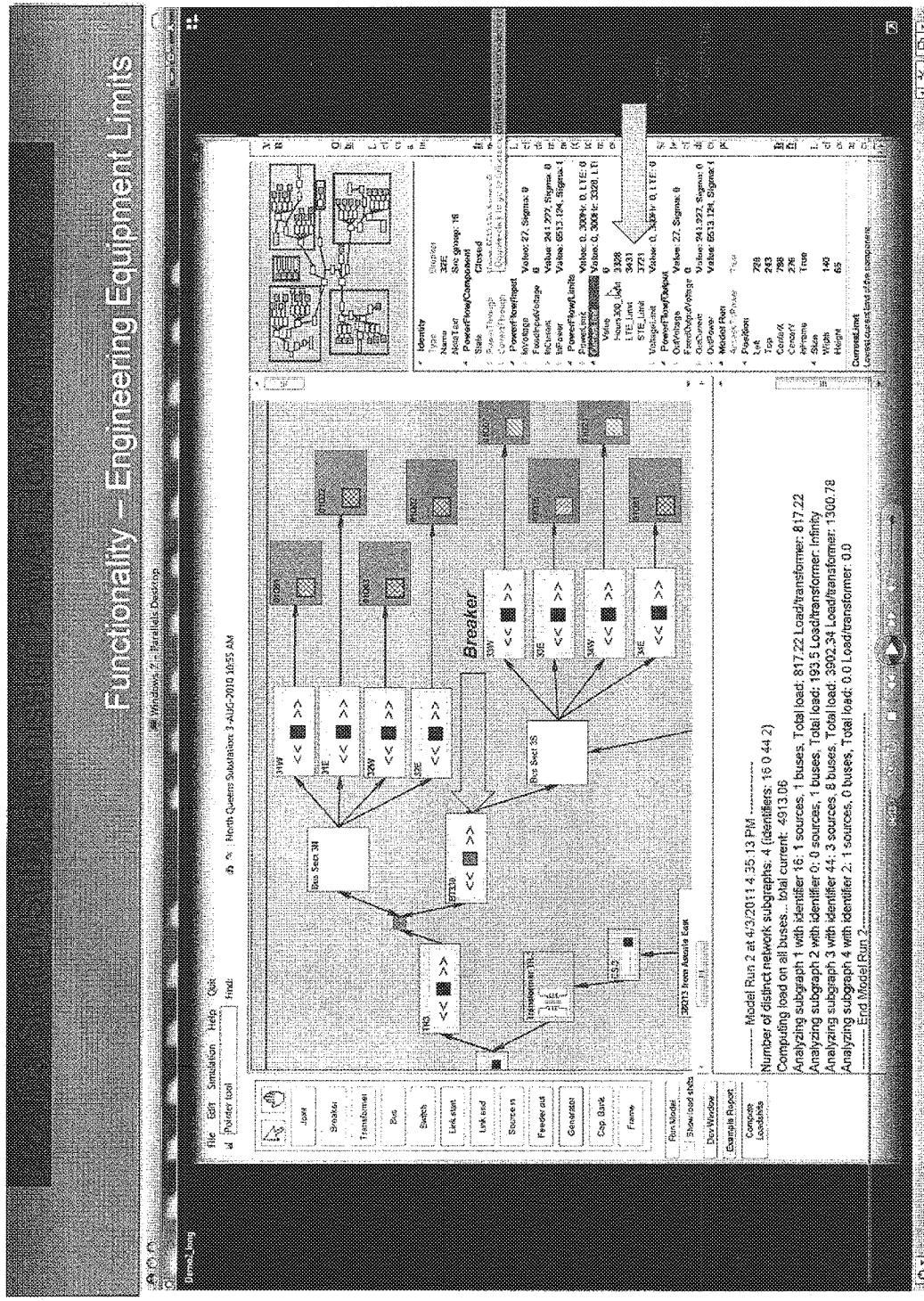
Figure 16:
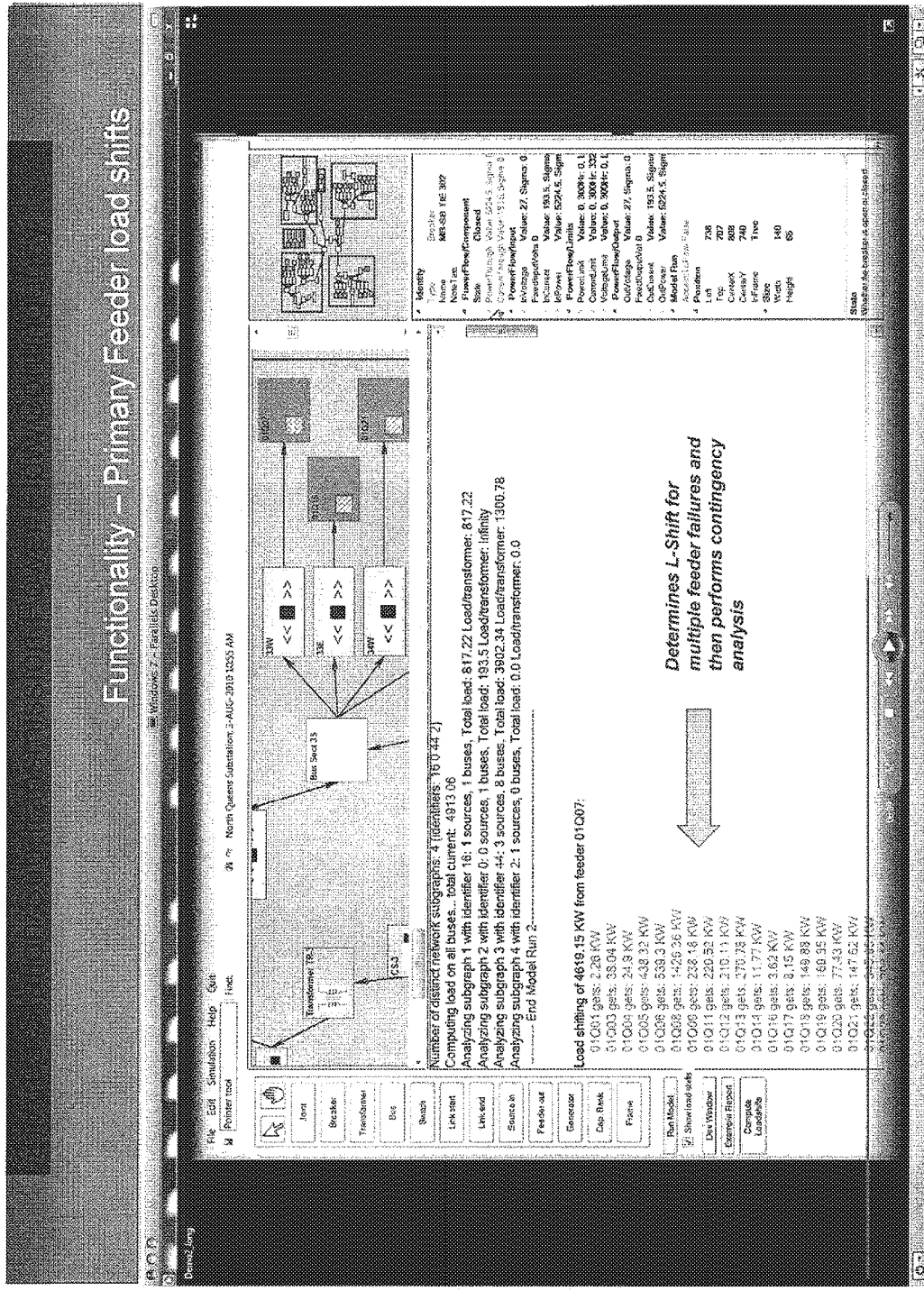
Figure 17:
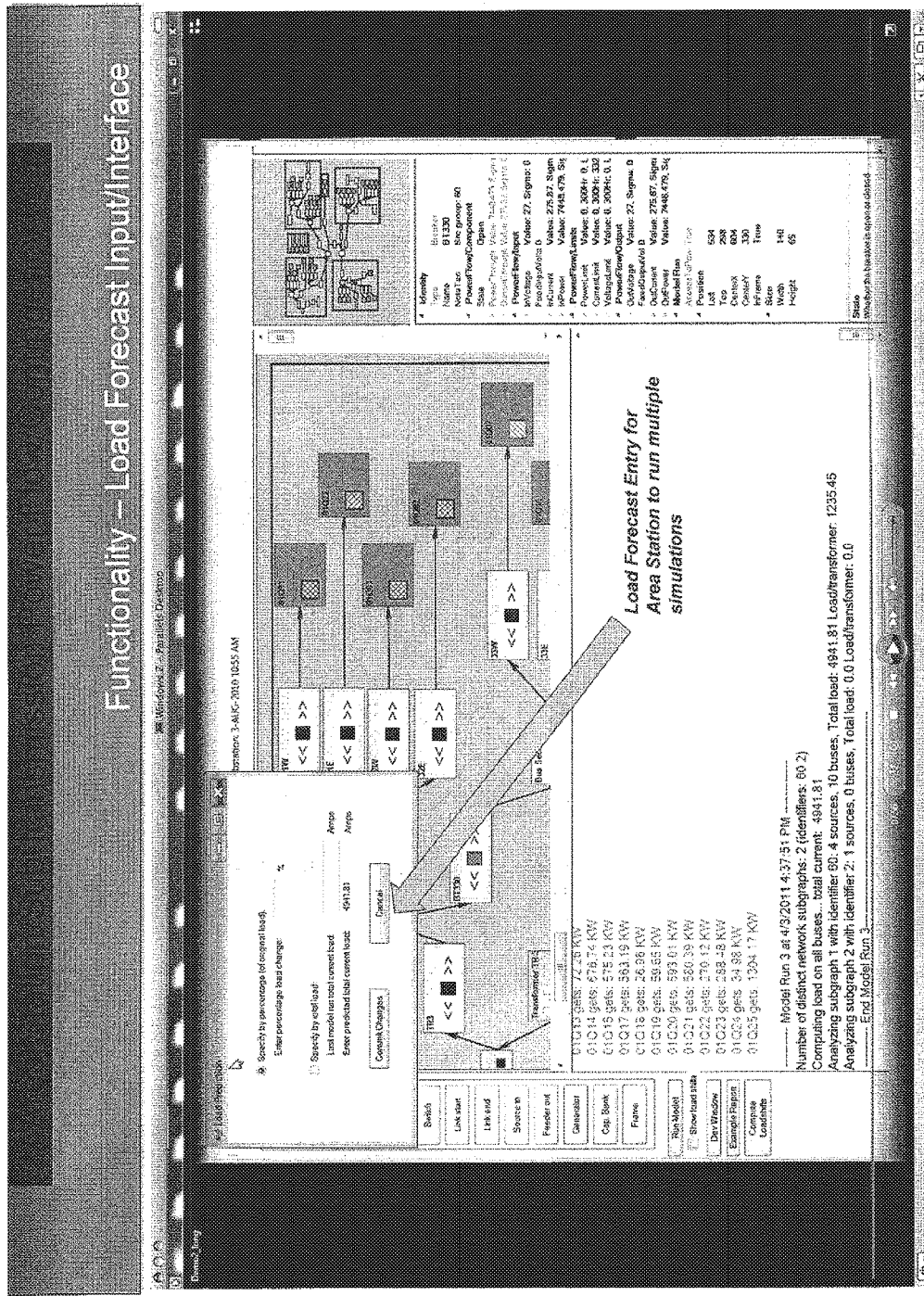
Figure 18:
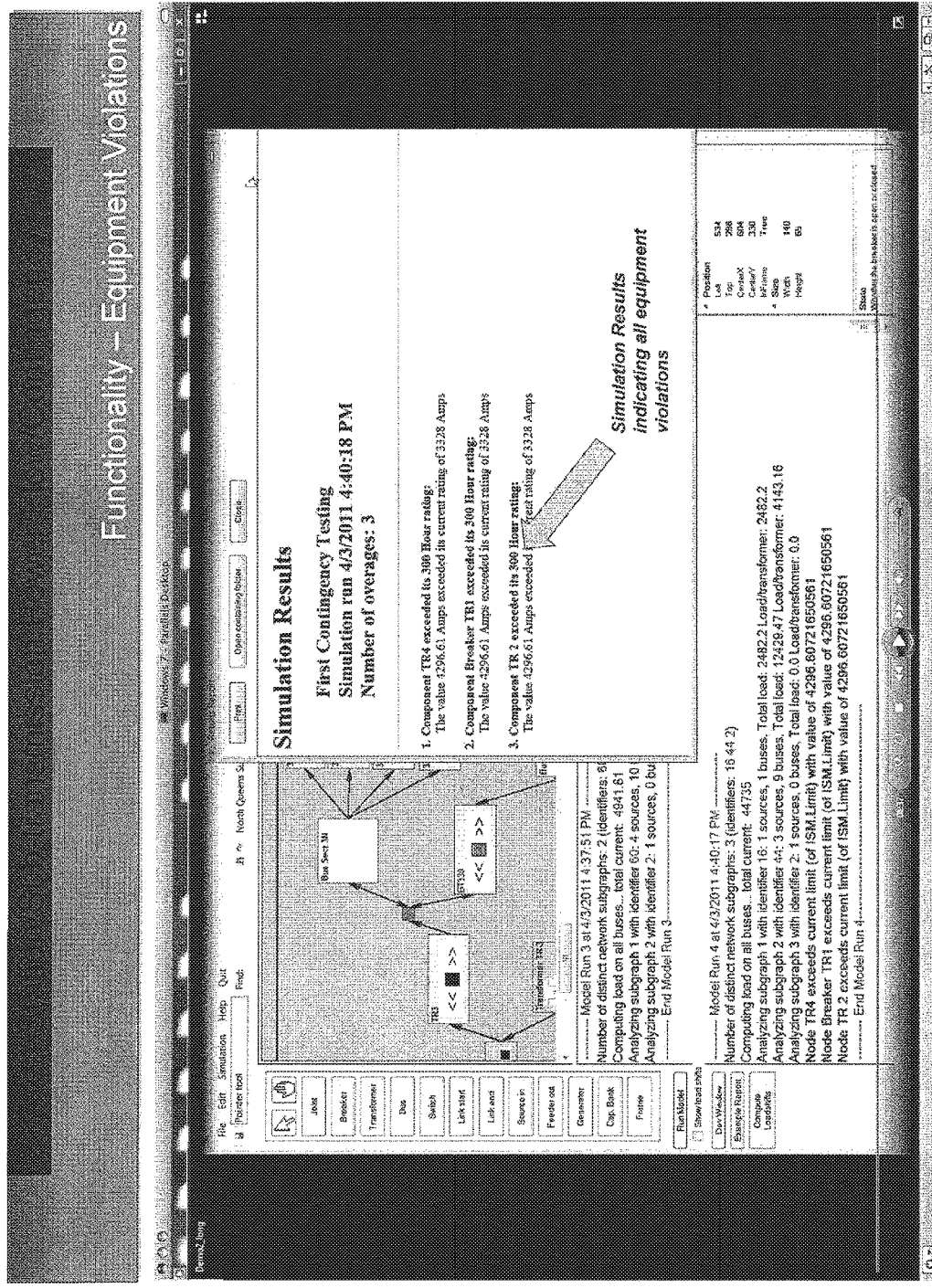

As shown in FIG. 14, the user has the capability of changing the configuration of the particular portion of the electrical grid that is analyzed. For example, a transformer can be added to the system model. The user can also specify the failure of a component, and the system outputs how the other components will react. As shown in FIG. 15, the system incorporates design basis limitations into the model. As shown in FIG. 16, the system can output load shifts and how much supply (e.g., supply from DR) or load reduction is required in response to a failure of a user-specified component. As shown in FIG. 17, the system allows for the input of load forecasts. As shown in FIG. 18, prospective equipment violations can also be specified based on the user-specified contingency.

Embodiments of the presently disclosed subject matter also provides improved infrastructure response to storms. Through actual vegetation management actions and locations of electric equipment, machine learning algorithms, such as but not limited to SVM and/or boosting, rankings of equipment susceptibility for a given type of storm (e.g., high temperature storms with strong winds from the east versus cold temperature storms with high soil moisture, with winds from the north).

In one embodiment, a machine learning system employs SVM or Boosting to determine the ranking and subsequent MTBF of tree-lined versus non tree lined electric equipment. Vegetation management history is used within the machine learning system to predict susceptibility to impending feeder outages, given a specific type and severity of approaching storm, to drive storm anticipation and response systems.

The DCAMS system can include software modules running on a computer, one or more processors, or a network of interconnected processors and/or computers each having respective communication interfaces to receive and transmit data. Alternatively, the software modules can be stored on any suitable computer-readable medium, such as a hard disk, a USB flash drive, DVD-ROM, optical disk or otherwise. The processors and/or computers can communicate through TCP/IP, UDP, or any other suitable protocol. Conveniently, each module is software-implemented and stored in random-access memory of a suitable computer, e.g., a work-station computer. The software can be in the form of executable object code, obtained, e.g., by compiling from source code. Source code interpretation is not precluded. Source code can be in the form of sequence-controlled instructions as in Fortran, Pascal or "C", for example.

Various modifications and alterations to the described embodiments will be apparent to those skilled in the art in view of the teachings herein. For example, hardware, such as firmware or VLSICs (very large scale integrated circuit, can communicate via a suitable connection, such as one or more buses, with one or more memory devices.

EXAMPLE 1

A load pocket "A" in an urban area is fed by a four transformer HTV "B" as shown in FIG. 5. The utility is supplying power from four medium voltage feeders from a single substation separately to each transformer. There are various DR sources and sinks owned by a large customer inside the load pocket, which can provide additional load or nega-watts in case of needed local curtailment. There is a 'plug and play' capability of the DR to communicate presence and demand of the grid, and a combination of old and new technologies for communication in the event that curtailed load can be necessary.

Figure 6:
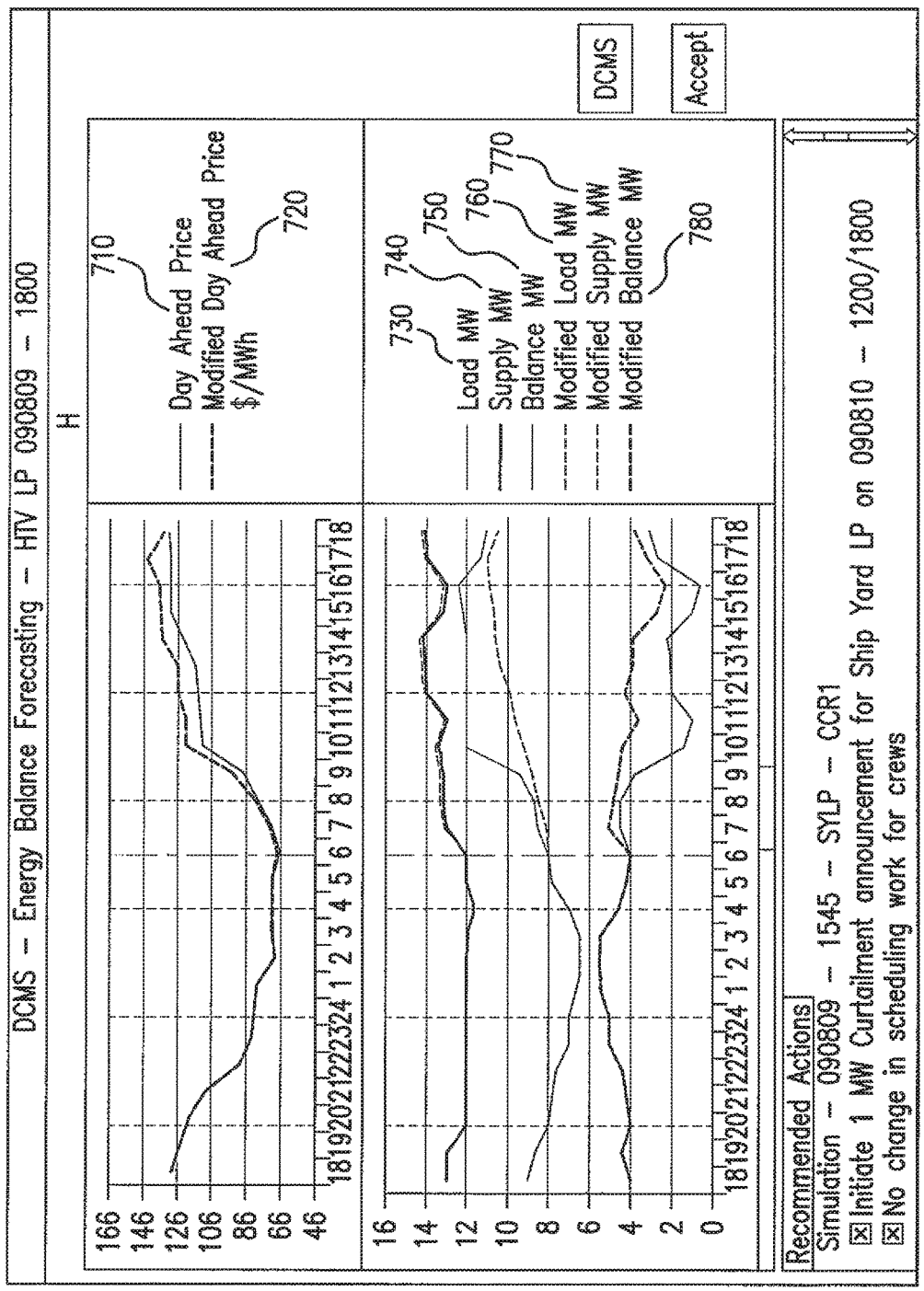
FIG. 6 depicts a prophetic control console of an exemplary DCAMS system described in Example 2 which forecasts electricity supply in advance of forecasted hot weather, and suggests and enables modifications to electricity pricing and costs to promote modifications in energy supply and usage patterns of assets discussed, for example, in FIG. 2, as well as work to be performed on the infrastructure to maintain sutiable levels of reliability.

In order for a utility to leverage the value of DR in combination with its own distribution assets, a high fidelity control system is desirable to predict future outcomes, continously evaluate the risks to reliability and efficiency, and act on those issues that could put the system in jeopardy of failure. DCAMS provides granular modulation of DR in addition to load curtailment verification and control. As shown in FIG. 6, the load pocket information is projected coming into the DCAMS from the Load Pocket A's several different DR sources that are processed in addition to the HTV B load and distribution grid SCADA coming in from the utility's equipment. Without an intelligent decision support system, a utility would have to ignore the DR in the Load Pocket A and build out more costly capital infrastructure such as an additional feeder and transformer for HTV B to supply peak load contingency supplies even though these additional DR assets exist in the local area.

EXAMPLE 2

There is a forecast for a hot summer day in a large northeastern city in the U.S. The utility plans ahead for each specific load pocket level in its region, based on predicted weather conditions, load estimates, and availability of supply. With the addition of a new generation of electric vehicles, it is desirable that the utility knows how these DR impact its system and its load pockets.

At 4 pm on the day before the predicted hot day, the utility would look to one of the DCAMS control consoles (FIG. 6) to plan the purchase of tomorrow's power. There is a potential of supply not meeting the required load in Load Pocket A given the future load required to be delivered to the the four transformers in HTV B. In FIG. 6, any load below Zero Balance means the utility cannot meet demand if a single emergency event of say the loss of one transformer in the HTV B via an Open Auto outage anywhere along the length of the 4 feeders from the substation to the HTV B.

The DCAMS prediction of what might happen tomorrow is based on the weather forecast and predictions of loads and supplies associated with Load Pocket A in view thereof. Through simulation, the controller would compute recommended actions to relieve this perceived crisis period when the Load Pocket A is near Zero Balance, this time through suppression of load by increasing the local price in Load Pocket A and curtailing load in HTV B.

As shown in FIG. 6, the day ahead price (710) and modified day ahead price (720) are computed given the changes made by the operator, or machine, to price setpoints of electricity. Load MW (730), supply MW (740), balance MW (750) are predicted for hours after 6 am (vertical dashed line), modified load MW (760), modified supply MW (770) and modified balance MW (780) are also computed as a result of changes made to electricity price setpoints offered to the DR at this specific location. The decision aid recommends an announcement be sent to the customer of HTV B that 1 MW of curtailable load may be required in this micro load pocket the next day from 10 am to 5 pm. In response thereto, the DCAMS alerts customers of large energy sinks in load pocket A, such as electric billboard customers, customers in large skyscrapers or facilities for charging electric vehicles, that voltage can be temporarily reduced. The DCAMS recommends to the customers that load be diverted to time periods when demand is not likely to be as high.

Note the "no change in scheduling of crews," in the recommended actions box at the bottom of FIG. 6, which indicates that this decision aid also recommends that no worker actions need be taken at this time based on the risk ranking of severity of an additional contingency situation actually occurring during the curtailment event. This recommendation is evaluated using data on the availability of crews as well as on the potential of remedying the grid overloads through such actions like changes in the position of electric switches within the area's electric system should an additional event happen.

In this example, the DCAMS uses a continuously updating machine learning evaluation of the multi-objective function required to maintain sufficient levels of reliability and efficiency of the smart grid.

In FIG. 6, the dashed lines are the predicted responses of the electric grid if the recommended changes to the pricing signals are acted on by the customers for this Load Pocket A as predicted or contractually obligated by agreements such as curtailment. The DCAMS learns the extent that load in the load pocket would change due to Price Responsive Load (PRL) responses in the past, and/or knowledge from previous testing that a certain number of electric vehicles can decide to become suppliers and add to capacity capability within this micro load pocket. The System Operator would either accept these recommendations or perform more simulations using DCAMS to decide what works best to meet the next day's forecasts.

EXAMPLE 3

Figure 7:
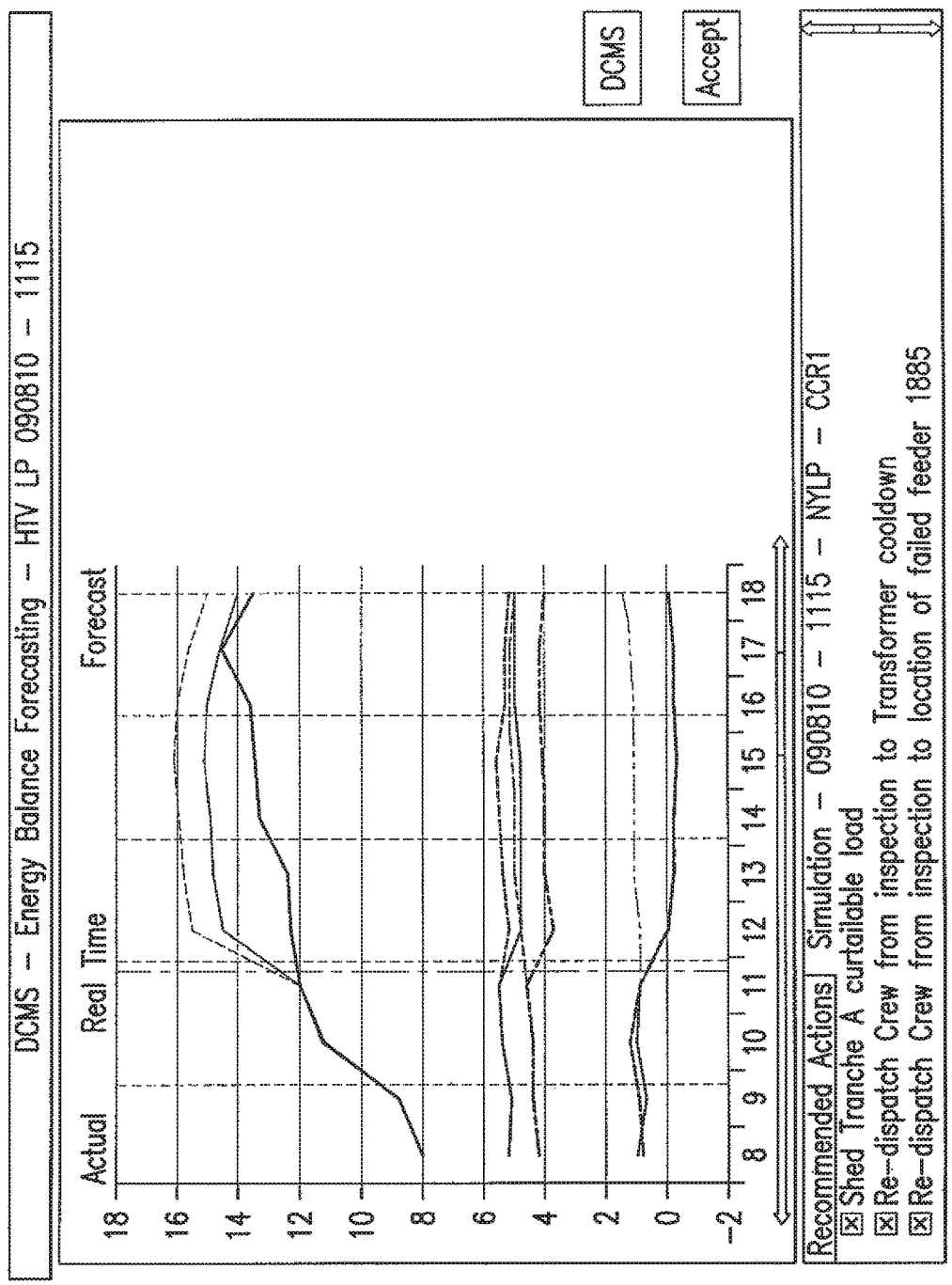
FIG. 7 depicts the control console of an exemplary DCAMS system described in Example 3 that provides historical, real-time, and forecasted load information.

It is now the day the hot weather arrives in Load Packet A, and suddenly there is a medium voltage feeder that Open Auto fails, causing one transformer out of the four in FIG. 5 to go out of service in this customer HTV B. The load falls below the Zero Balance level Load Pocket A and voltage is reduced. The utility must quickly act to get the system back to above Zero Balance to prevent loss of power to the customers or damage to the other three transformers in HTV B due to overload. In real-time, the DCAMS instantly and automatically curtails the charging of electric vehicles in all parking lots in Load Pocket A (FIG. 7). It recommends the utility also raise real-time market prices in the local area of Load Pocket A to entice price responsive load like electric billboards on buildings and non-emergency lighting to shut off. There is a switch that ties in more supply from nearby feeders at the substation, and DCAMS suggests this move after automatically performing model simulations that indicate that such a load transfer would not adversely affect other parts of the electric system. The DCAMS also re-dispatches crews to the location of the failed feeder as a result of detection of an additional transformer overload in HTV B that places the transformer at high risk of failure at the HTV B. As can be seen, the DCAMS, through model simulation and learning of demand and supply curves in this load pocket, makes recommendations to utilize the various levers available to the utility to maintain reliability. Other potential actions that DCAMS might recommend to operators for field crew deployment include, but are not limited to, those set forth in the Table below:

| SolutionID | SolutionDesc |
| --- | --- |
| 1 | Fix Open Main |
| 2 | Fix Limiter |
| 3 | Install New Sets of Mains |
| 4 | Adjust Network Transformer Tap |
| 5 | Adjust Feeder Bus Voltage |
| 6 | Close NWP Switch |
| 7 | Cool Banks - Water |
| 8 | Reduce Feeder Outage Duration |
| 9 | Install Higher Rated Components |
| 10 | Fix Bank Off |
| 11 | Fix RTU |
| 12 | Fix Blown Fuse |
| 13 | Remove Shunt |
| 14 | Remove D-Fault |
| 15 | Apply 1-phase ground |
| 16 | Apply 3-phase ground |
| 17 | HIPOT - Regular |
| 18 | HIPOT - Modified |
| 19 | HIPOT - AC |
| 20 | Cool Banks - Air |
| 21 | Run a shunt |
| 22 | Upgrade/repair service |
| 23 | Flush manhole |
| 24 | Replace Joints |
| 25 | Replace Cable Sections |
| 26 | Replace Transformer |

Figure 8:
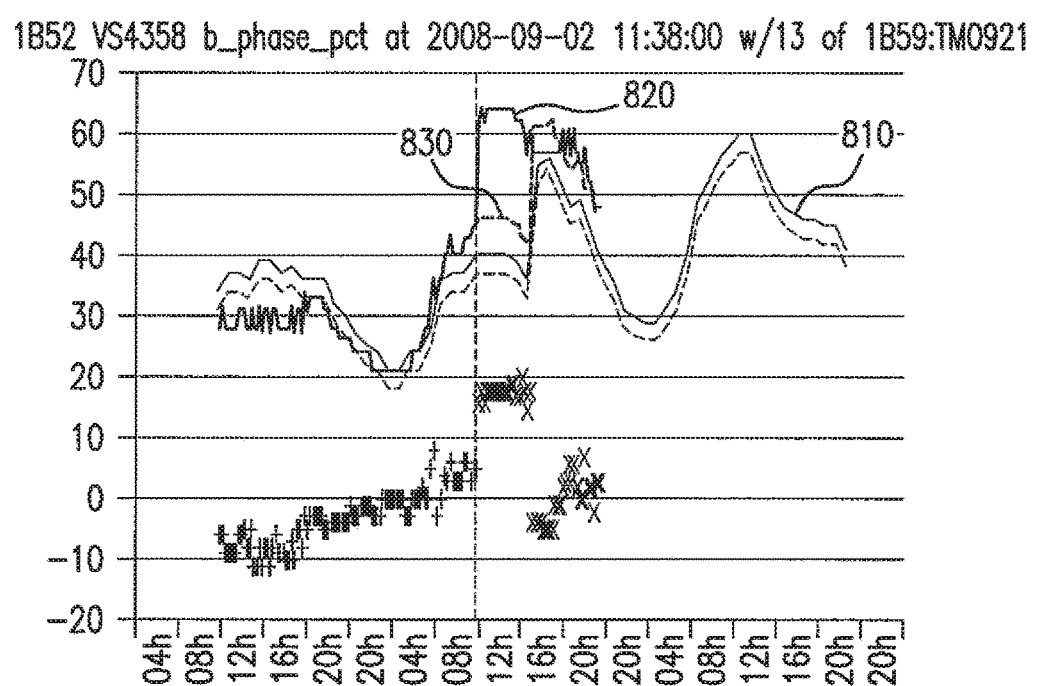
FIG. 8 depicts a graph of load (y-axis) over time on a single exemplary transformer during an overload anomaly, as described in Example 3.

One of the three remaining operational transformers in HTV suddenly presents an overload anomaly, as shown in FIG. 8. In FIG. 8, the vertical axis is load. The lower line (810) is predicted load on one transformer in the HTV. The upper line (820) indicates that this transformer is in danger of overheating because its load (820) has jumped from 45% to 75% of maximum safe operation rating (830). A Transformer Load Variance detection system alerts operators at the utility control center when more load than expected goes to the other than planned transformers during load shifting caused by feeder outages because of open main low voltage feeders.

The DCAMS also presents the System Operator with additional curtailment recommendations to shed Tranche A curtailable load customers as a result of this transformer anomaly, as indicated by the recommended actions box at the bottom of FIG. 7. Through smart management by the DCAMS of DR, such as curtailing charging on electric vehicles, turning off billboards and escalators, load relief via utility switching, and crew actions, a day that is disrupted by an emergency outage and overload is managed in real time, and the system is prevented from dropping below Zero Balance, and a blackout in Load Pocket A is averted. The margin between supply and load rises above zero as indicated by the dotted line in FIG. 7 and the transformer in HTV B's return to normal % of safe operational rating as seen in FIG. 8.

EXAMPLE 4

A prototype of the DCAMS is developed, complete with a weather-driven, software simulation of test cases like the above Load Pocket AIHTV B example with the various DR like electric vehicles, solar power, price responsive load, and curtailable loads. This example shows how the DCAMS would meet real field example requirements of an electrical utility company.

Figure 9:
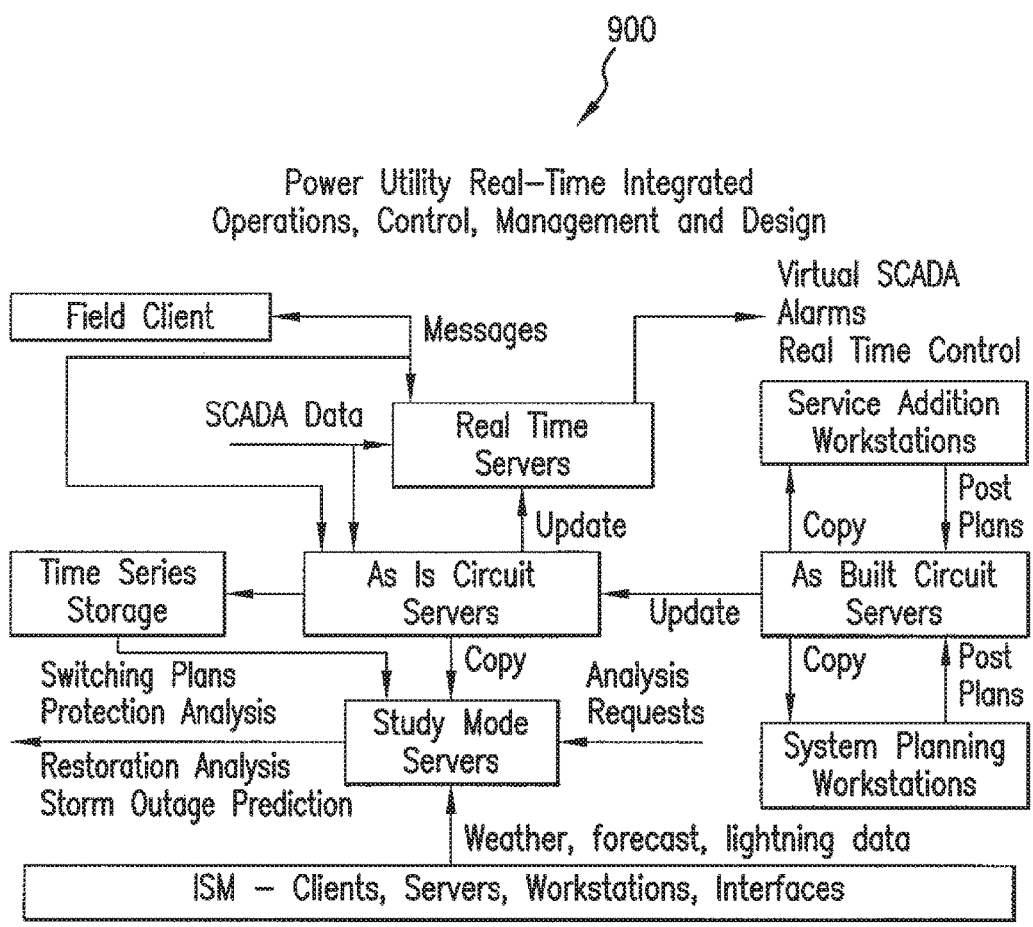
FIG. 9 depicts a model that can be used to simulate data in high fidelity with loads and distributed resources as described in Example 4.

A Power Utility Real-Time Integrated Operations, Control Management, and Design Architechture for DCAMS with loads and DR is modeled in FIG. 9. This model, based on Graph Trace Analysis (GTA), can be used as both an engineering model and an operational tool. The prototype uses model-based generic algorithms for design and control of reconfigurable interdependent systems. It's use eliminates the need for large matrix solvers, using instead compositions to implement polymorphism and simplify management using dependency components to structure analysis across different systems types using an implementation of hot-swappable algorithms.

The iterative nature of GTA provides distributed computation that allows convergence and solution of the multi-million node models conducive for an Integrated Systems Model of large urban utilities in seconds. Having this model as a base for the controller framework provides high potential for fast simulation for operator decision support that is fast enough for real-time grid control.

Figure 10:
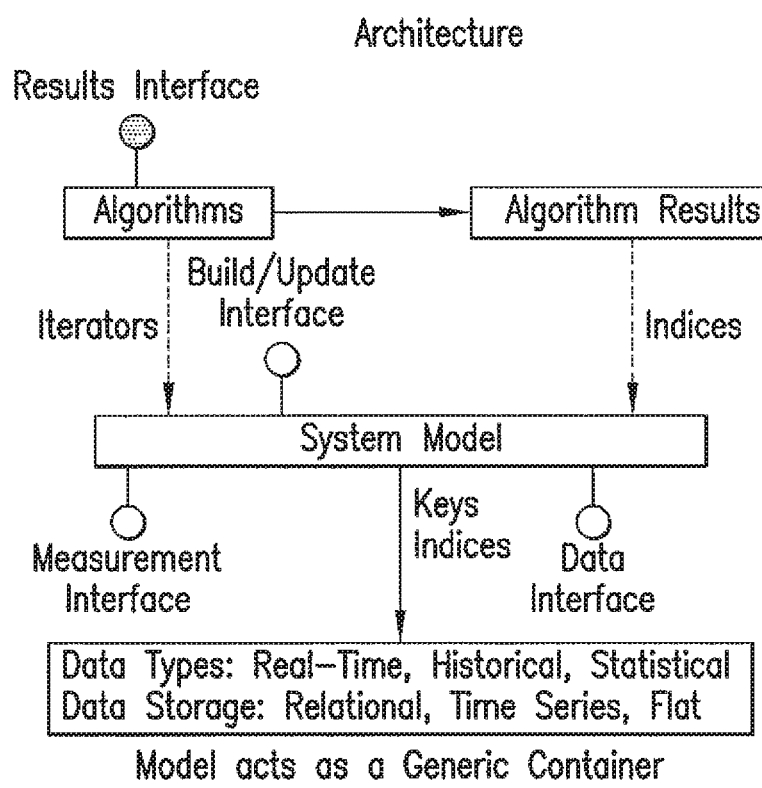
FIG. 10 provides a representation of commercially available software platform that can be simultaneously used by engineers for planning purposes, control operators for operations purposes, and crews in the field to execute day to day operational actions as described, for example, in Example 4.

FIG. 10 provides a representation of the GTA algorithms acting on the system model. The integrated system model allows system operations personnel to take field actions such as automatically opening or closing breakers through use of this model. This system model platform has allowed the same algorithms, such as DEW, to be used simultaneously by engineers in planning and for troubleshooting, by operators in the control room, and by crews in the field. In one embodiment, the DCAMS grid controller of FIG. 9 can piggyback on the Real Time Servers of power flow and contingency analysis algorithms, such as DEW's GTA-based power flow algorithm shown in FIG. 10.

The DCAMS can be positioned in Study Mode Servers to map out the dynamics of the electric grid for each tomorrow through use of data from existing SCADA and automated meter infrastructure. Upon fully learning tomorrow's optimal states and control policies, the DCAMS controller can then be used to control all facets of electric grid operations, from management of phase angle regulators, to breakers, to load shedding, to driving energy pricing based on system constraints. The Contingency Analysis Program Tool, disclosed in International Published Application No. WO 2009/117741 and hereby incorporated by reference, can be used in conjunction with the presently disclosed subject matter, and can provide system operators with decision support and assistance in identifying operational variances, measuring risks of future outages, and providing prioritized capabilities to modulate equipment, supply, crews, and current usage to prevent impending contingency emergencies from happening.

Figure 11:
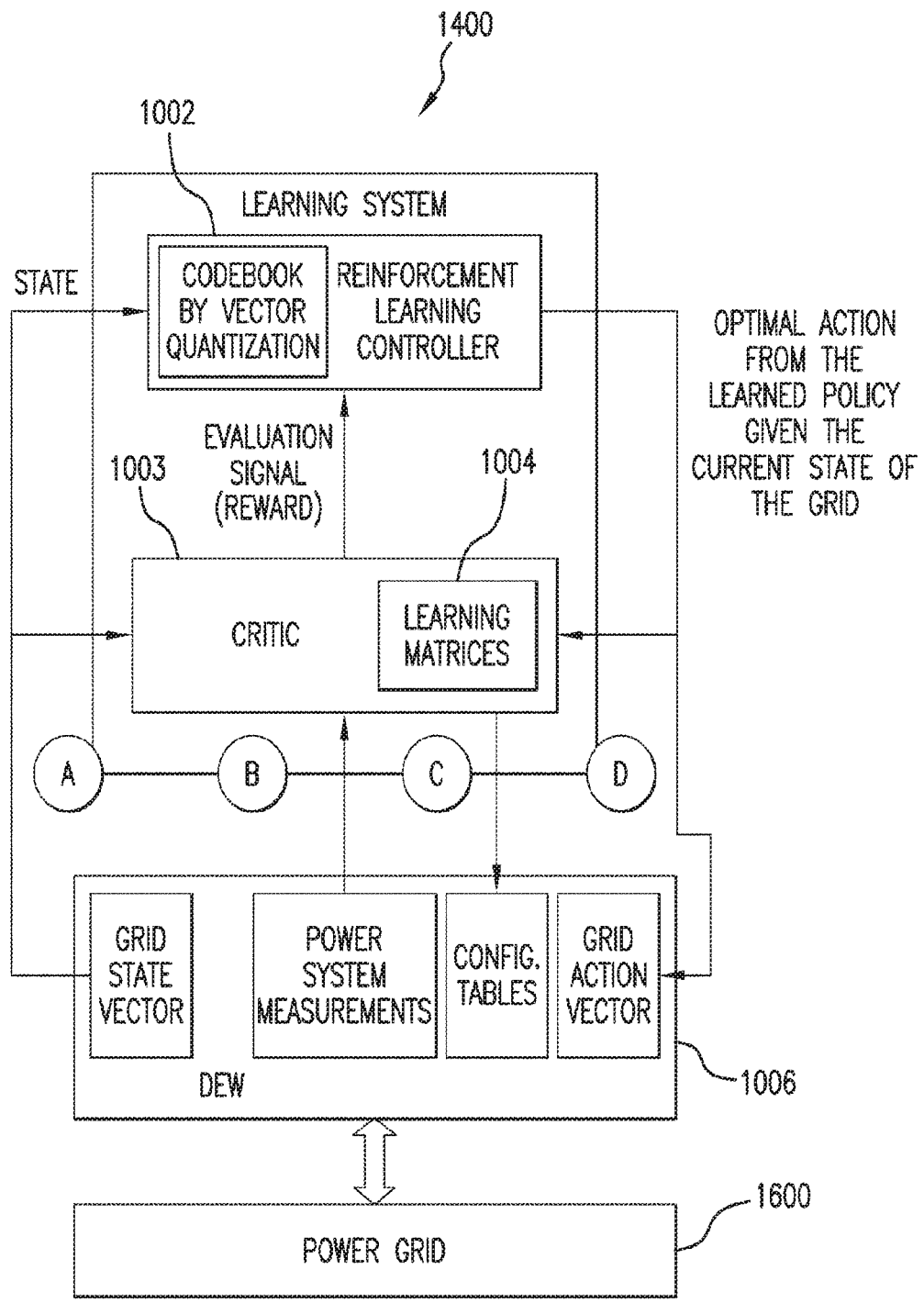
FIG. 11 provides a representation of an adaptive stochastic controller that can be used in the methods and systems of the presently disclosed subject matter.

FIG. 11 provides a summary of the stochastic controller platform disclosed in U.S. Pat. No. 7,395,252, which is hereby incorporated by reference. This stochastic controller platform can be used alone, or coupled with the DEW model, described above, and used as the algorithmic computational engine in accordance with the methods and systems of the presently disclosed DCAMS. The stochastic controller uses Approximate Dynamic Programming (ADP), combined with Mixed-Integer Nonlinear Programming solvers. ADP is used as a decomposition strategy that breaks the problem of continuous grid management, with its long time horizon, into a series of shorter problems that the Mixed-Integer Nonlinear Programming solver can handle. The ADP framework also provides a way of treating uncertainty from both operational and financial standpoints, simultaneously. To achieve this, the stochastic controller has combined Real Option valuation with operational policy and action determination using the same ADP algorithms within the Adaptive Stochastic Controller. The result is maximization of real option value as a control objective that are merged control objectives driven efficient and safe operations. The ADP Adaptive Stochastic Controller optimizes by solving the Hamilton-Jacobi-Bellman equation using a unique formulation of ADP interacting with the Integrated System Model (ISM) via feedback loops and a critic function, similar to the way models are used in Model Predictive Control (MPC). This approach is considerably different from prior work in transmission control using Dynamic Programming (i.e., Approximate Dynamic Programming is not equivalent to Dynamic Programming).

FIG. 11 shows the system architecture and the operation of an exemplary Learning System 1400, used for a critical feature of the stochastic controller, which can be set up for training operators of a distributed electrical power grid 1600. Learning system 1400 includes a reinforcement-learning controller 1002, optional learning matrices 1004 that are used within critic function 1003, and a model 1006 of power flow within the utility electric grid 1600. The subject power grid can include regional power generation, transmission, and distribution grids as well as integrated transcontinental power grids (e.g., the eastern interconnect f the North American power grid).

The integrated system controller approach that the DCAMS uses employs simultaneous modeling of business processes and scheduling of three things: Assets, Energy (in the form of curtailment and supply of integrated DR and distribution grid processes), and Field Crew Deployment. The best use of Business Process Modeling (BPM) in the dispatch and monitoring of crews via the DCAMS is analyzed.

Designing and constructing a simulation environment to test and verify the DCAMS is thus provided. A region within an electric utility's territory is isolated so that the utlity can explore how various DR sources and sinks react under abnormal circumstances such as emergency situations. Responses to DR related pricing signals is also studied. The cause and effect between the distribution grid and the charging and discharging of electric vehicles and other DR tools such as storage and generation into and out of the Load Pocket Test Sites are also analyzed. The scheduling of curtailable load, coupled with feedback by way of verification mechanisms that can eventually learn how to successfully predict how to manage loads during curtailment obligations for the entirety of the utility operating region.

EXAMPLE 5

Figure 12:
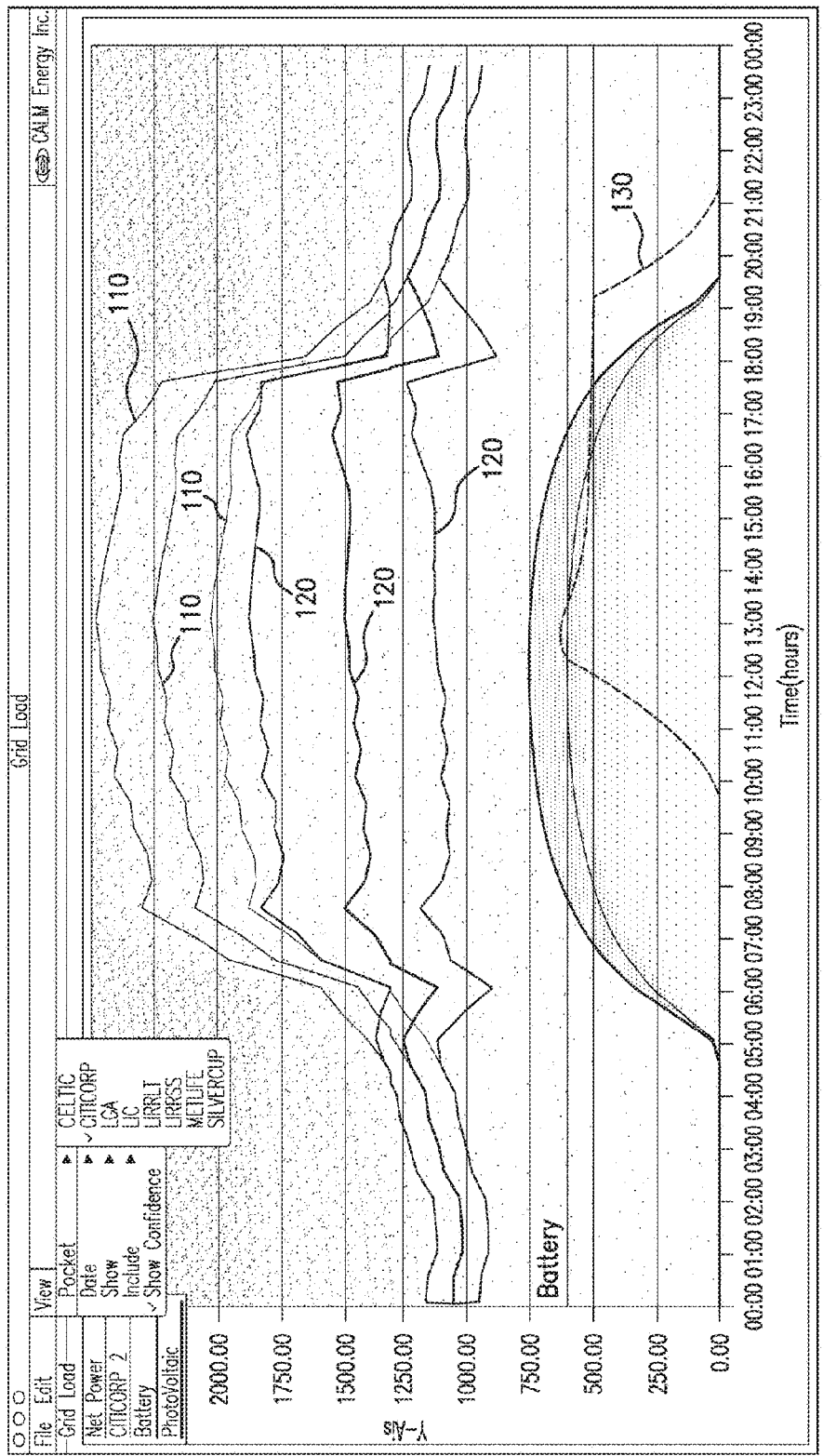
FIG. 12 depicts a hypothetical day-ahead electric load for an urban skyscraper, as described in Example 5.

The DCAMS system can be used in concert with AMI and past metering of building loads and unique supplies (e.g, solar) to determine the confidence of loads and supplies for a large building. Predicted day ahead electric load fro a skyscraper or manufacturing facility is calculated with possible variances to this load (top three lines in FIG. 12 (110)). With the addition of predicted solar supply for the day at this building with its expected variance ($2\sigma$), the load on the grid can be lowered even though predicted load variance can widen significantly (120). Energy Storage (130) can be manually manipulated by the building manager, or utility if under its control, to supply DR energy into the building load to further offset requirements of the grid. Alternatively, the DCAMS can operate the BMS (Building Management System). In one embodiment, DCAMS can operate the BMS using real options valuation based on either historical or predicted outcomes of energy market pricing or additional pricing provided by the utility in this specific location for improvements in reliability and efficiency.

EXAMPLE 6

Figure 13:
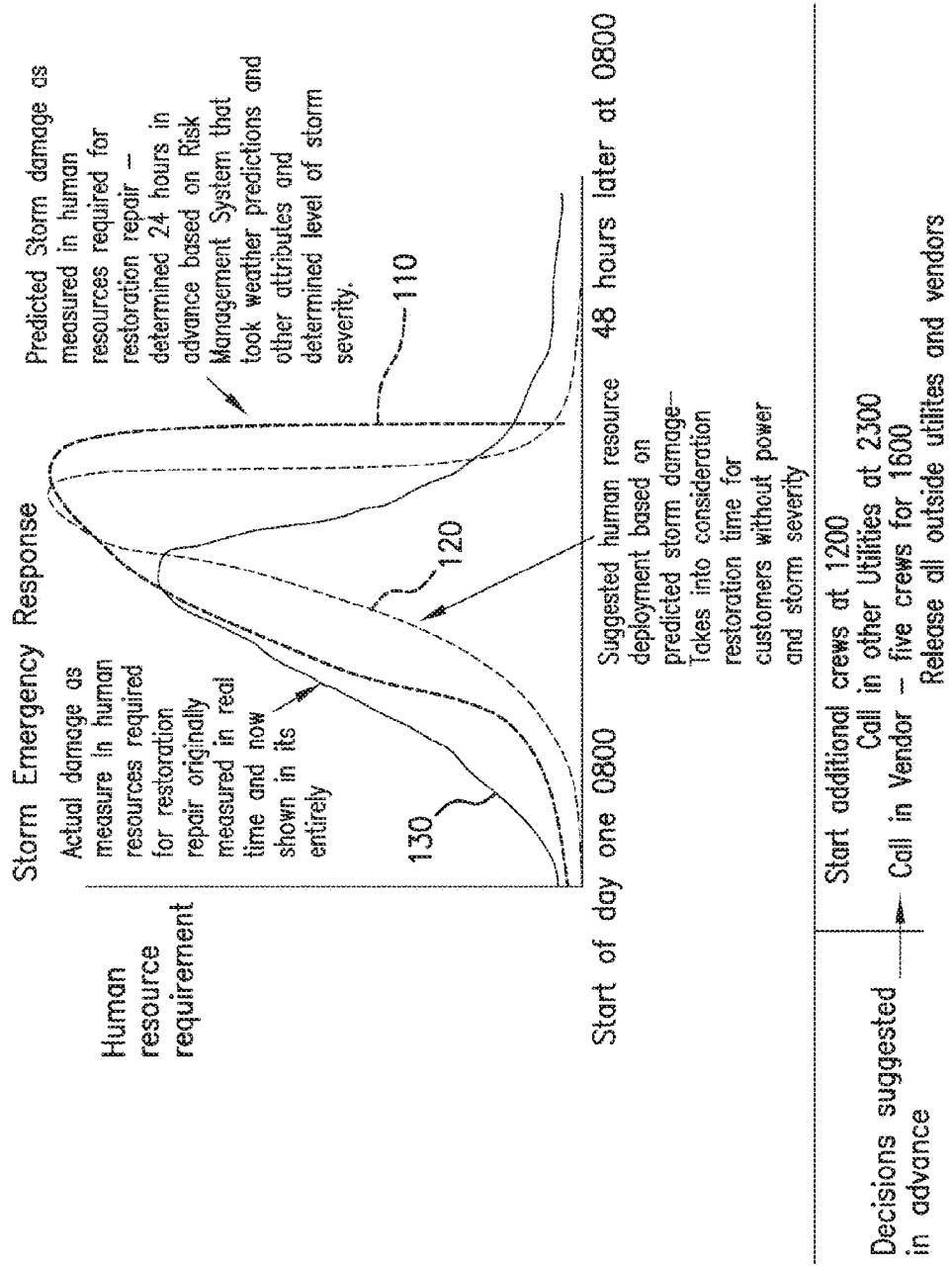
FIG. 13 depicts the storm emergency response in view of the attributes model described in Example 6.

In addition to all the above, the DCAMS can provide a suggestion of resources required to respond to predicted outages during severe weather events hitting overhead utility systems. As shown in FIG. 13, the following attributes are input into a machine learning system to predict the resources required to respond to the coming storm emergency: soil type in the immediate area of each pole, pole design, pole digging type (rock bore versus dug soil), wind direction, wind speed, amounts of precipitation predicted, land gradients (e.g., proximity to mountains or hills), location of trees in relation to transmission and distribution lines and roads, size of trees, elevation of equipment, in view of historical data regarding past momentary outages based on observed wind and speed. Deployment strategies are then sent to the storm emergency team so that they can most effectively respond to the coming damage.

Assuming looking at the red (110) and blue (120) dash curves at 0800 the morning before a major storm event. The capability of determining when to actually call in additional crews, when to have called in five crews for 1600 hours and to call in other utilities for a 2300 start with an understanding in advance of when they will most like be released is very valuable planning tool. Most scheduling of crews must be done many hours in advance to get them available in time to respond to outages. If one waited until all the failures already took place, then outage durations would be significantly longer than if crews were prepared and prepositioned at the right time to respond to predicted levels of storm damage. Just as important is when you should start releasing crews or deciding that they not respond for the next shift do to reductions in additional storm damage. Through predictions of DCAMS of expected damage based on storm formation and severity, there are significant reductions in the cost of responding to storms. If one were to look at the actual solid blue line (130), the actual damage can be seen, which was closely predicted at 0800. As the storm unfolds, obviously, more accuracy at the moment will allow changes to actions to further refine the response.

The presently disclosed subject matter is not to be limited in scope by the specific embodiments described herein. Indeed, various modifications, in addition to those described herein, will become apparent to those skilled in the art from the foregoing description and the accompanying figures. Such modifications are intended to fall within the scope of the appended claims.

It is further to be understood that all values are approximate, and are provided for description.

Patents, patent applications, publications, product descriptions, and protocols are cited throughout this application, the disclosures of each of which is incorporated herein by reference in its entirety for all purposes.

What is claimed is:

1. A system, comprising:
   at least one dynamic contingency avoidance and mitigation system (DCAMS) control console,
   wherein the at least one DCAMS console is configured to display a predictive load resource management output indicative of a simulation modeling of at least one integrated Demand Response (iDR) action which is related to implementing at least one resource-related activity over at least one distribution grid for at least one resource,
   wherein the at least one resource-related activity is at least one of: at least one resource curtailment activity and at least one resource supply activity;
   at least one communication interface which is specifically designed to physically interface with at least one infrastructure network comprising the at least one distribution grid and a plurality of resource-consuming assets, resource-producing assets, or both;
   at least one DCAMS processor which is configured to perform at least the following:
   dynamically scheduling and initiating, over a particular time period, the at least one iDR action;
   electronically receiving, via the at least one communication interface, iDR action feedback data representative of an implementation of the at least one iDR action;
   dynamically verifying the iDR action feedback data to determine at least one verified iDR action effect resulting from the at least one iDR action, wherein the at least one verified iDR action effect is at least representative of at least one change in:
   i) resource load,
   ii) resource supply,
   iii) resource pricing,
   iv) resource cost, and
   v) any combination thereof;
   dynamically performing, utilizing a machine learning engine and based, at least in part on the at least one verified iDR action effect, at least one simulation modelling to obtain the predictive load resource management output which is indicative of a prediction on how to manage, by at least one utility, resource loads during at least one future iDR action for at least one utility-operated region;
   wherein the predictive load resource management output comprise at least one recommended future resource-related activity to be performed by the at least one utility during a resource deficiency concern period in the at least one utility-operated region to at least mitigate a potential infrastructure equipment usage which is above a designed capacity at a specific location; and
   outputting, via the at least one DCAMS console, the predictive load resource management output.

2. The system of claim 1, wherein the at least one recommended future resource-related activity is an electronic recommendation alert to be transmitted to at least one customer of the at least one utility, wherein the electronic recommendation alert recommends the at least one customer curtailment of a resource load for at least one time period.

3. The system of claim 1, wherein the at least one DCAMS processor is further configured to perform a sequential Monte Carlo analysis using a topological model of the at least one distribution grid located in the at least one utility-operated region to determine a mean time between failure (MTBF) and a mean time to repair (MTTR) to result in the predictive load resource management output which provides reliability statistics for the at least one distribution grid located in the at least one utility-operated region in real time and during predicted future resource crisis time periods.

4. The system of claim 1, wherein the at least one distribution grid is an electrical grid and the at least one resource is electricity.

5. The system of claim 4, wherein the electricity is obtained, at least in part, from one or more sources selected from wind power, solar power, battery power, geothermal power, tidal power and nuclear power.

6. The system of claim 4, wherein the at least one resource curtailment activity is curtailing a load associated with at least one of electrical vehicle charging, building load, energy storage, distributed generation, and any combination thereof.

7. The system of claim 1, wherein the dynamically performing the at least one simulation modelling is further based on at least one weather pattern, at least one customer use pattern, or both.

8. The system of claim 7, wherein the at least one recommended future resource-related activity is based on at least one predicted weather pattern, at least one predicted customer use pattern, or both.

9. The system of claim 8, wherein the at least one predicted customer use pattern is based, at least in part, on a customer response to a hypothetical change to a real-time cost of the at least one resource attributed to at least one customer.

10. The system of claim 1, wherein the machine learning engine includes one of a martingale boosting algorithm, a SVM algorithm, Monte Carlo risk assessment, and a combination thereof.

11. A method, comprising:
    causing, by at least one programmed dynamic contingency avoidance and mitigation system (DCAMS) processor, to display a predictive load resource management output indicative of a simulation modeling of at least one integrated Demand Response (iDR) action on at least one DCAMS control console, wherein the iDR action is related to implementing at least one resource-related activity over at least one distribution grid for at least one resource,
    wherein the at least one resource-related activity is at least one of: at least one resource curtailment activity and at least one resource supply activity;
    dynamically scheduling and initiating, by the at least one DCAMS processor, over a particular time period, the at least one iDR action;
    electronically receiving, via at least one communication interface, by the at least one DCAMS processor, iDR action feedback data representative of an implementation of the at least one iDR action over at least one infrastructure network comprising a plurality of the at least one distribution grid and a plurality of resource-consuming assets, resource-producing assets, or both;
    dynamically verifying, by the at least one DCAMS processor, the iDR action feedback data to determine at least one verified iDR action effect resulting from the at least one iDR action, wherein the at least one verified iDR action effect is at least representative of at least one change in:
    i) resource load,
    ii) resource supply,
    iii) resource pricing,
    iv) resource cost, and
    v) any combination thereof;

dynamically performing, by the at least one DCAMS processor, utilizing a machine learning engine and based, at least in part on the at least one verified iDR action effect, at least one simulation modelling to obtain the predictive load resource management output which is indicative of a prediction on how to manage, by at least one utility, resource loads during at least one future iDR action for at least one utility-operated region;

wherein the predictive load resource management output comprise at least one recommended future resource-related activity to be performed by the at least one utility during a resource deficiency concern period in the at least one utility-operated region to at least mitigate a potential infrastructure equipment usage which is above a designed capacity at a specific location; and outputting, by the at least one DCAMS processor, via the at least one DCAMS console, the predictive load resource management output.

12. The method of claim 11, wherein the at least one recommended future resource-related activity is an electronic recommendation alert to be transmitted to at least one customer of the at least one utility, wherein the electronic recommendation alert recommends the at least one customer curtailment of a resource load for at least one time period.

13. The method of claim 11, further comprising:
dynamically performing, by the at least one DCAMS processor, a sequential Monte Carlo analysis using a topological model of the at least one distribution grid located in the at least one utility-operated region to determine a mean time between failure (MTBF) and a mean time to repair (MTTR) to result in the predictive load resource management output which provides reliability statistics for the at least one distribution grid located in the at least one utility-operated region in real time and during predicted future resource crisis time periods.

14. The method of claim 11, wherein the at least one distribution grid is an electrical grid and the at least one resource is electricity.

15. The method of claim 14, wherein the electricity is obtained, at least in part, from one or more sources selected from wind power, solar power, battery power, geothermal power, tidal power and nuclear power.

16. The method of claim 14, wherein the at least one resource curtailment activity is curtailing a load associated with at least one of electrical vehicle charging, building load, energy storage, distributed generation, and any combination thereof.

17. The method of claim 11, wherein the dynamically performing the at least one simulation modelling is further based on at least one weather pattern, at least one customer use pattern, or both.

18. The method of claim 17, wherein the at least one recommended future resource-related activity is based on at least one predicted weather pattern, at least one predicted customer use pattern, or both.

19. The method of claim 18, wherein the at least one predicted customer use pattern is based, at least in part, on a customer response to a hypothetical change to a real-time cost of the at least one resource attributed to at least one customer.

20. The method of claim 11, wherein the machine learning engine includes one of a martingale boosting algorithm, a SVM algorithm, Monte Carlo risk assessment, and a combination thereof.

* * * * *